United States Patent [19]

Iwamoto et al.

[11] Patent Number: 5,521,036
[45] Date of Patent: May 28, 1996

[54] POSITIONING METHOD AND APPARATUS

[75] Inventors: Yoshichika Iwamoto, Kumagaya; Hiroki Tateno, Kawasaki; Nobutaka Magome, Kawasaki; Hiroki Okamoto, Kawasaki, all of Japan

[73] Assignee: Nikon Corporation, Tokyo, Japan

[21] Appl. No.: 409,921

[22] Filed: Mar. 23, 1995

Related U.S. Application Data

[63] Continuation of Ser. No. 209,231, Mar. 14, 1994, abandoned, which is a continuation-in-part of Ser. No. 93,725, Jul. 20, 1993, abandoned.

[30] Foreign Application Priority Data

Jul. 27, 1992 [JP] Japan .................................. 4-199725
Mar. 15, 1993 [JP] Japan .................................. 5-053451

[51] Int. Cl.$^6$ ................................................ G03F 9/00
[52] U.S. Cl. ........................ 430/22; 430/5; 430/312; 430/322; 356/400; 356/401; 250/548
[58] Field of Search ........................ 430/5, 22, 312, 430/322; 356/400, 401; 250/548

[56] References Cited

U.S. PATENT DOCUMENTS

| | | | |
|---|---|---|---|
| 4,558,949 | 12/1985 | Uehara et al. | 356/152 |
| 4,650,983 | 3/1987 | Suwa | 250/204 |
| 4,770,531 | 9/1988 | Tanaka et al. | 356/358 |
| 4,908,656 | 3/1990 | Suwa et al. | 355/53 |
| 4,952,815 | 8/1990 | Nishi | 250/548 |
| 5,229,872 | 7/1993 | Mumola | 430/22 |
| 5,262,822 | 11/1993 | Kosugi et al. | 355/53 |

Primary Examiner—S. Rosasco
Attorney, Agent, or Firm—Shapiro and Shapiro

[57] ABSTRACT

A positioning method involving the following steps is disclosed. Measured are coordinates positions of at least three preselected exposure areas on a static coordinate system among a plurality of exposure areas two-dimensionally formed in accordance with predetermined array coordinates on a photosensitive substrate. Calculative array coordinates of the plurality of exposure areas on the static coordinate system are calculated by using a plurality of first parameters calculated by statistically calculating the plurality of measured coordinate positions. Then, the photosensitive substrate is positioned in an exposure position while being moved in accordance with the calculative array coordinates thus calculated. Specific marks formed on a mask are thus exposed on each of a plurality of predetermined positions on the photosensitive substrate. Measured further are coordinate positions of latent images of at least three specific marks on the static coordinate system among images (latent images) of a plurality of specific marks exposed. The plurality of these measured coordinate positions are statistically calculated, thereby calculating a plurality of second parameters used for obtaining coordinate positions of each of the plurality of specific marks (latent images) on the static coordinate system. Next, each of the plurality of exposure areas on the photosensitive substrate is aligned with an exposure position in accordance with a deviation between the parameter representing an array offset among the plurality of first parameters and the parameter representing an array offset among the plurality of second parameters. Besides, particularly the specific marks of the mask are exposed within a non-exposure domain (where no base pattern is formed) in the vicinity of the outer periphery of the photosensitive substrate.

17 Claims, 18 Drawing Sheets

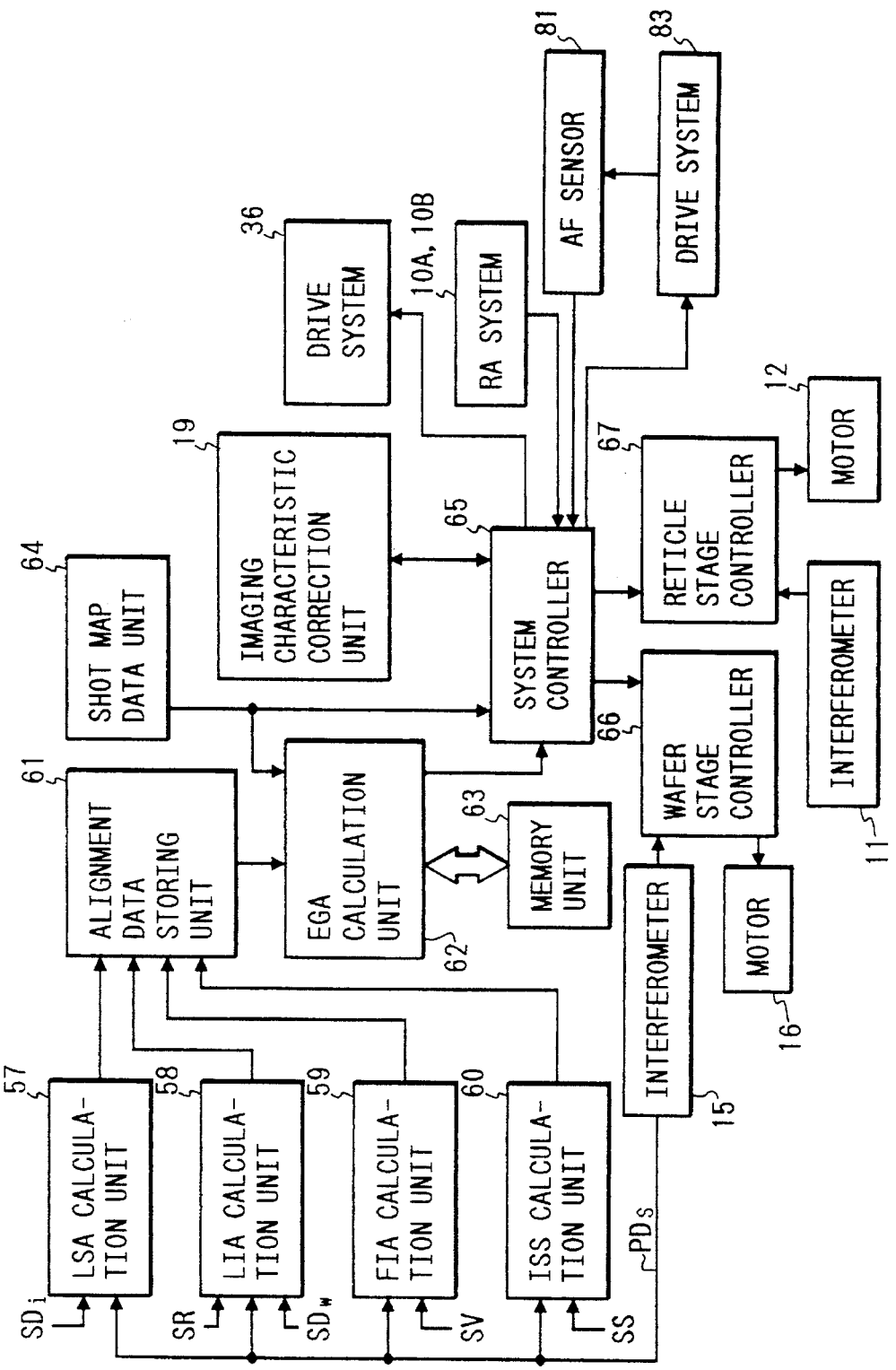

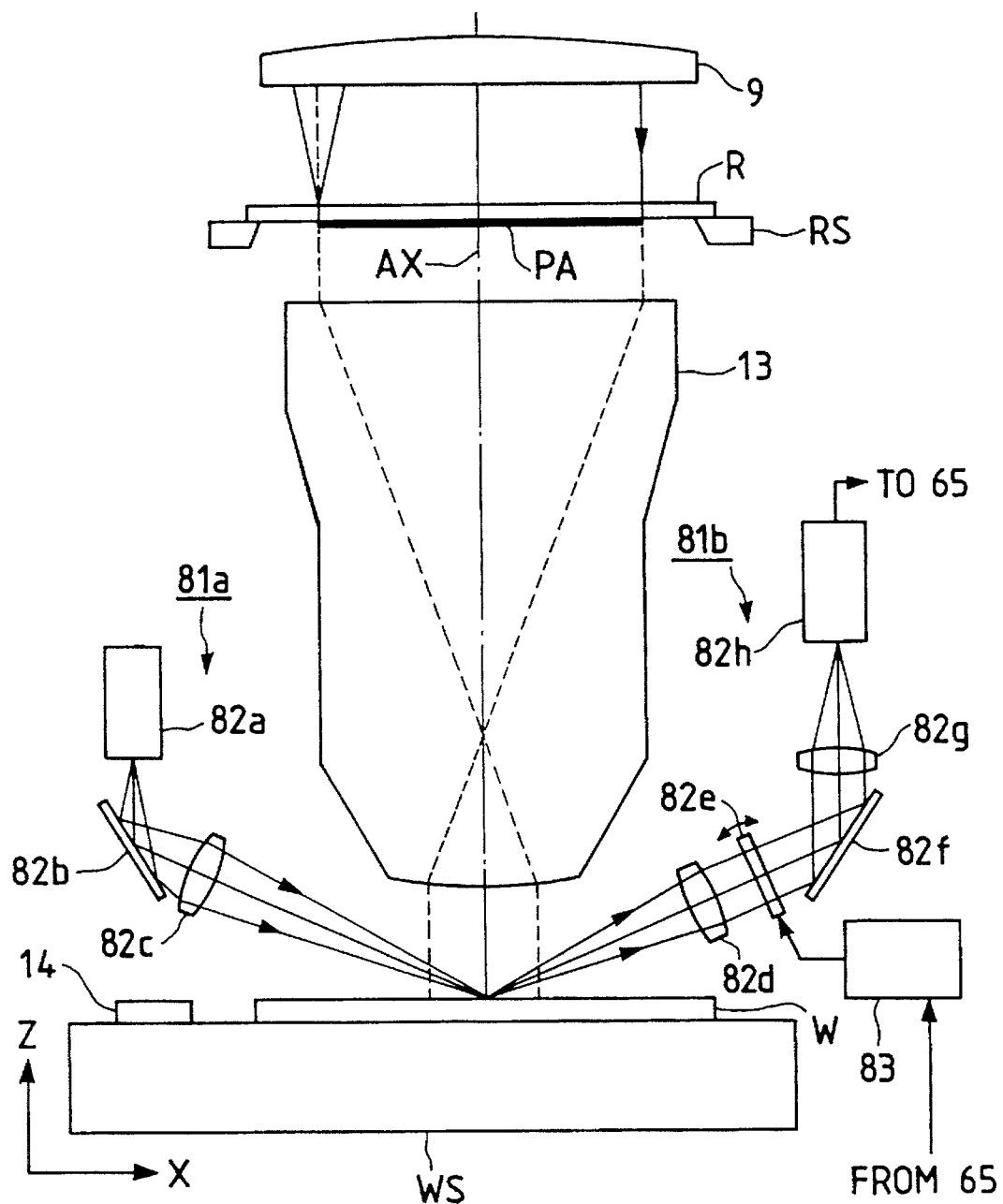

POSITIONING METHOD AND APPARATUS

This is a continuation of application Ser. No. 08/209,231 filed Mar. 14, 1994, which is a continuation-in-part of application Ser. No. 08/093,725 filed Jul. 20, 1993, both now abandoned.

BACKGROUND OF THE INVENTION

1. Field of the Invention

The present invention relates to a positioning method and apparatus suitable for an exposure apparatus employed in a lithography process of manufacturing semiconductor elements and liquid crystal devices.

2. Related Background Art

In recent years, in the lithography process of manufacturing the semiconductor elements, a reduction projection type exposure apparatus of a step-and-repeat system, a so-called stepper, has been often employed as an apparatus for transferring patterns formed on a mask or a reticle onto a photosensitive substrate (a wafer or a glass plate having its surface on which a photoresist is applied with a high resolving power. In this type of stepper is provided with an alignment sensor of a TTL (Through The Lens) system which is disclosed in, e.g., U.S. Pat. No. 5,151,750. The alignment sensor is intended to precisely align a projection image of the reticle pattern with each of a multiplicity of circuit patterns formed on the wafer. This alignment sensor is a combined version of an alignment sensor (laser Step Alignment; LSA system) disclosed in, e.g., U.S. Pat. No. 4,677,301 and an alignment sensor (Laser Interferometric Alignment; LIA system) disclosed in, e.g., U.S. Pat. No. 4,710,026, whereby the optical members are shared at the maximum. Herein, the LSA system irradiates on-wafer alignment marks (diffraction grating marks) with elongate band-like spot beams. Beams of diffraction light generated from the marks are photoelectrically detected. On the other hand, the LIA system irradiates the diffraction grating marks with two laser beams coming from two directions different from each other, thereby forming one-dimensional interference fringes. There are photoelectrically detected beams of interference light of the diffraction beams generated from the marks in the same direction.

At present, a dominant alignment system of the stepper is an enhanced global alignment system (EGA) disclosed in, e.g., U.S. Pat. Nos. 4,780,617 and 4,833,621. The following is an explanation of the EGA system. At least three, e.g., seven shot areas located in the vicinity of the outer periphery of the wafer are selected from a multiplicity of circuit pattern areas (shot areas) on the wafer. This selection is done in advance of effecting an overlay exposure on a single piece of wafer. Further, two (X- and Y-directional) alignment marks (wafer marks) attached to each of these selected shot areas are detected by an alignment sensor. Coordinate positions of each mark are measured (sample alignment). Thereafter, totally six error parameters relative to array characteristics of the shot areas on the wafer are determined based on those mark positions (measured values) and design values by statistic calculations (least squares method). The error parameters are, to be specific, offsets (X- and Y-directions) of the central position of the wafer, degrees of expansion/contraction (X- and Y-directions) of the wafer, a residual rotational quantity of the wafer and a perpendicularity of the wafer stage (or perpendicularity of the shot array). Then, design coordinate values are corrected with respect to all the shot areas on the wafer on the basis of values of the determined parameters. The wafer stage is stepped according to the corrected coordinate values (calculated values). As a result, a projection image of the reticle pattern is overlaid on each of the multiplicity of shot areas on the wafer, thereby performing the exposure.

By the way, when performing the exposure with the reticle pattern superposed on the wafer shot area, the projection image of the reticle pattern and the shot area deviate in terms of positions in the X- and Y-directions. The positional deviations are caused due to changes both in reticle position and in baseline and also variations both in projection magnification of a projection optical system and in distortion. This conduces to such a problem that a sufficient overlay (alignment) accuracy can not be obtained. Under such circumstances, according to the prior arts, the overlay exposure (trial burning) of the reticle patterns (vernier patterns, etc.) on a pilot wafer is conducted. The alignment sensor or an inspection device for an exclusive use detects a deviation quantity between two (a main scale pattern and a vernier pattern) resist images formed in the wafer by development processing. When actually effecting the overlay exposure, the above-mentioned deviation quantity is given as an offset to the measured result of the alignment sensor. The projection image of the reticle pattern can be thereby superposed precisely on the shot area.

The above-mentioned method, however, requires the pilot wafer for the exclusive use of the measurement. Besides, a problem arises, wherein a measuring time increases depending on the development processing. For this reason, as disclosed in, e.g., U.S. Pat. No. 4,741,622, there is proposed a method of utilizing the latent images formed on a resist layer by irradiating the reticle marks with the exposure light. According to the method disclosed in the forgoing publication, the reticle pattern is aligned with one shot area on the wafer by use of the alignment sensor. Thereafter, the reticle mark is irradiated with the exposure light in advance of a main exposure, thereby forming its latent image on the resist layer. Then, the identical alignment sensor simultaneously detects latent images of wafer marks (base marks) already formed concomitantly with the shot area and of the reticle marks formed in the vicinities of the wafer marks. Positional deviation quantities therebetween are thus obtained. Further, the reticle and the wafer are relatively moved in accordance with these positional deviation quantities. That is, a realignment is executed. After this realignment, the main exposure is started, and the projection image of the reticle pattern can be precisely overlaid and exposed on the on-wafer shot area. Note that the alignment method utilizing the latent images is also disclosed in, e.g., U.S. Pat. Nos. 4,640,619, 5,124,927, 5,148,214, 5,140,366 and 5,262,822.

The method described above does not require the pilot wafer and, beside, has such an advantage that the positional deviation (offset) can be measured in a short time without effecting the development processing. Further, the following problem is to be produced. When measuring the Positional deviation quantity per shot area on the wafer by utilizing the latent images as described above, a processing time per wafer increases. This results in a decreas in throughput of the apparatus. For this reason, the measurement mentioned above is executed with respect to only, e.g., the top (1st) shot area on the wafer. The reticle pattern may be aligned (alignment) with each of shot areas after the 2nd shot area by use of the positional deviation quantities measured before.

All the on-wafer shot areas are aligned by employing the positional deviation quantity measured in the top shot area. In this instance, however, if the shot area deviates in position due to the expansion/contraction (scaling) or the like of the wafer, the problem is that the precise superposition can not be done even when Giving the above-stated positional deviation quantity as an offset. Moreover, it is difficult to perform the precise superposition even by executing an offset correction based on the positional deviation quantities, depending on a measuring accuracy (reproducibility) of the alignment sensor. Further, the latent images are detected by the alignment sensor using the illumination light exhibiting substantially the same wavelength zone as that of the exposure light. In this case, a problem is caused, wherein optical characteristics of the latent images vary due to the irradiation of the illumination light, and an adverse influence is exerted on the measuring accuracy. In addition, the latent images of the reticle marks are invariably formed in the vicinities of the wafer marks (base marks). A constraint in terms of forming positions thereof is large, and, besides, the latent images are formable as base marks in the vicinities of the wafer marks on the next layer. Consequently, there is also induced such a problem that the alignment accuracy on the next layer is reduced because of the base marks (pseudo alignment marks) of these latent images.

Further in the stepper, it is necessary to effect alignment in X- and Y-directions perpendicular to the optical axis of the aforedescribed projection optical system and alignment (focusing) in Z-direction parallel to the optical axis of the projection optical system. That is, the surface of the wafer must be made coincident with the best imaging plane (best focus plane) of the projection optical system within the range of the depth of focus thereof. For this purpose, the position (best focus position) of the best imaging plane of the projection optical system in Z-direction is found as disclosed, for example, in U.S. Pat. Nos. 4,908,656 and 4,952,815. Then, as disclosed, for example, in U.S. Pat. Nos. 4,558,949 and 4,650,983, the wafer is moved in Z-direction by the use of a focus detecting system (AF sensor) of the oblique incident light type to thereby make the surface thereof with the best focus plane.

However, in the method disclosed in U.S. Pat. No. 4,908, 656, the developing process must be carried out, and this leads to the inconvenience that the measurement time becomes long. Also, a pilot wafer exclusively for use for measurement is used, and this has led to a problem that the influence of the ground or the like of a wafer to which the pattern of a reticle is actually transferred (a process wafer) cannot be taken into account and the result of this measurement is not always the best focus position to the process wafer. Further, in the method disclosed in U.S. Pat. No. 4,952,815, the influences of the ground of the process wafer and photoresist or the like have not at all been taken into account and likewise, the best focus position has not always been measured accurately.

SUMMARY OF THE INVENTION

It is a primary object of the present invention, which has been devised in view of the points given above, to provide a positioning method capable of forming latent images of reticle marks in arbitrary positions on a photosensitive substrate and aligning a mask pattern with a shot area at a high accuracy without decreasing the throughput.

Further, it is an object of the present invention to provide an aligning method which, by the utilization of the latent image of a reticle mark, can make the surface of a photosensitive substrate with the best imaging plane of a projection optical system without reducing the throughput and yield and with the formation conditions of the photosensitive substrate taken into account highly accurately.

According to the present invention, there are measured coordinate positions of at least three preselected exposure areas on a static coordinate system among a plurality of exposure areas two-dimensionally formed in accordance with predetermined array coordinates on a photosensitive substrate. Calculative array coordinates of the plurality of exposure areas on the static coordinate system are calculated by using a plurality of first parameters calculated by statistically calculating the plurality of measured coordinate positions. Then, the photosensitive substrate is positioned in an exposure position while being moved in accordance with the calculative array coordinates thus calculated. Specific marks formed on a mask are thus exposed on each of a plurality of predetermined positions on the photosensitive substrate. Measured further are coordinate positions of latent images of at least three specific marks on the static coordinate system among images (latent images) of a plurality of specific marks exposed. The plurality of these measured coordinate positions are statistically calculated, thereby calculating a plurality of second parameters used for obtaining coordinate positions of each of the plurality of specific marks (latent images) on the static coordinate system. Next, each of the plurality of exposure areas on the photosensitive substrate is aligned with an exposure position in accordance with a deviation between the parameter representing an array offset among the plurality of first parameters and the parameter representing an array offset among the plurality of second parameters. Besides, particularly the specific marks of the mask are exposed within a non-exposure domain (where no base pattern is formed) in the vicinity of the outer periphery of the photosensitive substrate.

According to the present invention, the plurality of first parameters are calculated by statistically calculating the coordinate positions of at least three on-the-photosensitive-substrate exposure areas on the static coordinate system. Each of the calculative array coordinates of the plurality of on-the-photosensitive-substrate exposure areas on the static coordinate system is obtained by using the plurality of first parameters. The specific marks of the mask are exposed in each of the plurality of positions on the photosensitive substrate in accordance with the calculative array coordinates. Therefore, the specific marks of the mask can be exposed in the arbitrary position on the photosensitive substrate. There exist no constraint in terms of the forming positions of the latent images. In particular, the latent images of the specific marks can be formed within the non-exposure domain in the vicinity of the outer periphery of the photosensitive substrate. Hence, no latent image is formed in the vicinities of the alignment marks (base marks) concomitant with the exposure areas. It is also possible to prevent the decrease in the alignment accuracy on the next layer due to the formations of the latent images.

Further, there are statistically calculated the coordinate positions of the latent images of at least three specific marks on the static coordinate system among the images (latent images) of the plurality of specific marks. The plurality of second parameters are thereby calculated, wherein these parameters are employed for calculating the coordinate positions of each of the plurality of specific marks (latent images) on the static coordinate system. Then, each of the plurality of exposure areas on the photosensitive substrate is aligned with the exposure position in accordance with the deviation between the parameter representing the array offset among the plurality of first parameters and the parameter representing the array offset among the plurality of second parameters. It is therefore possible to measure the positional deviation quantity during the overlay exposure at the high accuracy without depending on the measuring reproducibility of the alignment sensor and invariably attain the highly accurate alignment.

As explained above, according to the present invention, the system offset is calculated by applying the EGA system. The offset can be therefore measured at a high speed and as well as at a high accuracy. Besides, the latent image marks are formable in arbitrary positions on the photosensitive substrate. The advantage is that there is not a constraint in terms of locations to form the latent images. Especially when forming the latent images in the non-exposure domain, the latent images are not disposed in the vicinities of the alignment marks on the photosensitive substrate. There can be obtained such an effect that it is feasible to prevent the decrease in the alignment accuracy on the next layer due to the pseudo alignment marks formable on the base in the form of latent images. Further, the wafer marks and the latent image marks are detectable by the sperate alignment sensors. Namely, the alignment sensors optimal to the detections of the respective marks are selectively usable, thereby making it possible to improve the measuring accuracy particularly of the system offset.

Also, the present invention is applied to the alignment of the best imaging plane of a projection optical system and the surface of a photosensitive substrate. So, in the present invention, a mask on which a particular mark is formed is disposed on the object plane side of the projection optical system and the projected image of the particular mark of the mask is exposed onto the photosensitive substrate while the photosensitive substrate is positioned at each of a plurality of positions in the direction of the optical axis of the projection optical system. Further, illuminating light is applied to each of the latent images of a plurality of particular marks formed on the photosensitive substrate and the light reflected by the photosensitive substrate is photoelectrically detected to thereby determine the best imaging plane (best focus position) of the projection optical system. Subsequently, the surface of the photosensitive substrate is positioned at this best focus position thus determined, and the image of the pattern formed on the mask is exposed onto the photosensitive substrate. At this time, the latent image of the particular mark of the mask is formed in the other area on the photosensitive substrate than the area onto which the image of the pattern of the mask is exposed, for example, near the outer periphery of the photosensitive substrate or in the street line area of the photosensitive substrate. Further, in the present invention, an exposure amount about three times as great as the proper exposure amount of the photosensitive substrate (which differs depending on the kind or the like of photoresist) may preferably be given when the projected image of the particular mark is exposed onto the photosensitive substrate. Also, particularly in the present invention, a diffraction grating mark is used as the particular mark. Two beams may be applied to the latent image of the particular mark and the interference light of the diffracted lights generated from that latent image substantially in the same direction may be received, whereby the best focus position of the projection optical system may be determined on the basis of the intensity of the interference light of each latent image.

Now, the invention has found by experiment that when the latent image of the particular mark is formed on the photosensitive substrate at each of a plurality of positions in the direction of the optical axis of the projection optical system, the intensity of light generated from the latent image varies in conformity with those positions in the direction of the optical axis. So, the best focus position of the projection optical system is determined on the basis of the intensity of light obtained from each of a plurality of latent images on the photosensitive substrate, that is, the location in the direction of the optical axis which corresponds to the latent image for which the intensity of light becomes maximum or minimum is determined as the best focus position. Further, the inventor has made such design that the latent image of the particular mark is formed on the photosensitive substrate onto which the image of the pattern of the mask is exposed, whereby the best focus position of the projection optical system which is optimum for the formation conditions of the photosensitive substrate (such as the ground, the kind and film thickness of the photoresist) can be determined. Therefore, the photosensitive substrate exclusively for use for measurement and the developing process become unnecessary, and the surface of the photosensitive substrate can be aligned with the best imaging plane of the projection optical system highly accurately without the throughput being reduced. Also, during the formation of the latent image of the particular mark, an exposure amount about three times as great as the proper exposure amount of the photosensitive substrate is given to the photosensitive substrate and therefore, the detection accuracy of the latent image can be improved.

BRIEF DESCRIPTION OF THE DRAWINGS

Other objects and advantages of the present invention will become apparent during the following discussion in conjunction with the accompanying drawings, in which:

FIG. 3 is a block diagram of a control system of the apparatus shown in FIG. 1;

FIG. 23 shows the construction of a focus detecting system (AF sensor) of the oblique incident light type provided in the projection exposure apparatus of FIG. 1.

DESCRIPTION OF THE PREFERRED EMBODIMENTS

Figure 1:
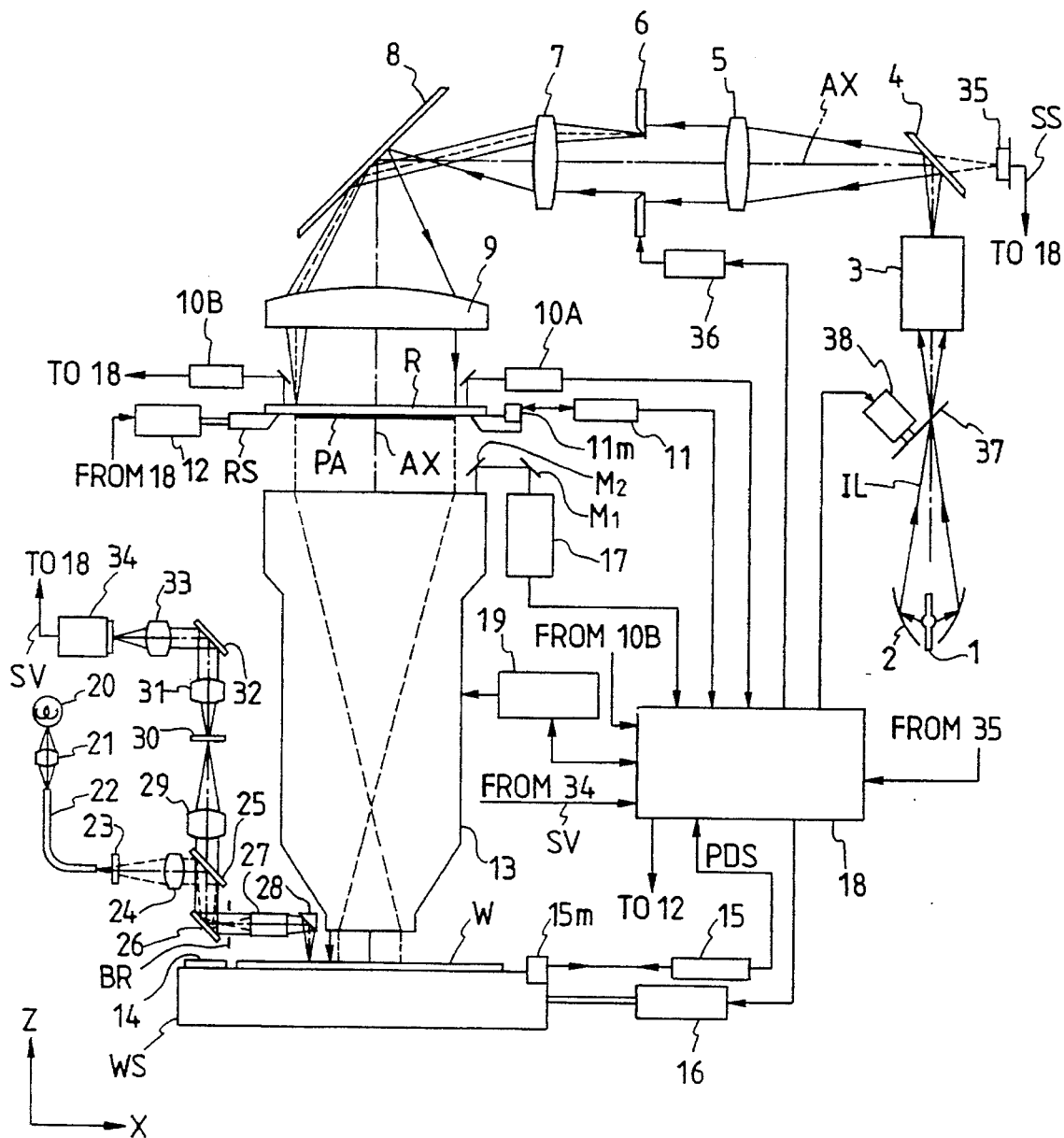
FIG. 1 is a view schematically illustrating a construction of a projection exposure apparatus suitable for an application of a positioning method in an embodiment of the present invention.
Figure 2:
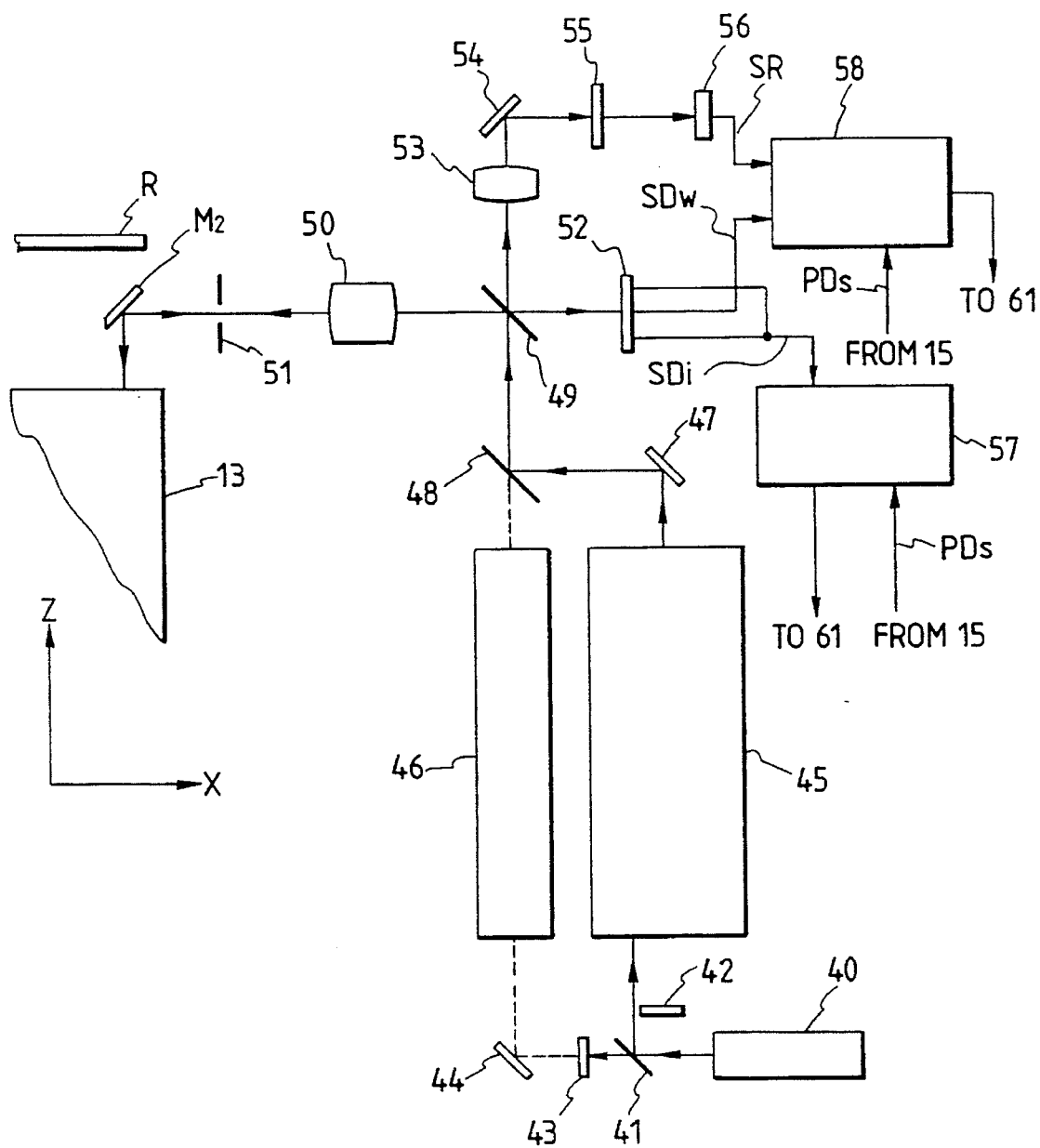
FIG. 2 is a view showing a specific configuration of a TTL system alignment sensor shown in FIG. 1.

FIG. 1 is a view schematically illustrating a construction of a projection exposure apparatus suitable for an application of a positioning method in an embodiment of this invention. FIG. 2 is a view showing a specific configuration of a TTL system alignment sensor shown in FIG. 1. FIG. 3 is a block diagram depicting a control system of the apparatus shown in FIG. 1. An outline of the construction of the projection exposure apparatus will hereinafter be described.

Referring to FIG. 1, a beam of illumination light IL emitted from an ultra high pressure mercury lamp 1 is reflected by an elliptic mirror 2. The illumination light IL is once converged at a second focal point and is thereafter incident on an illumination optical system 3 including a collimator lens, an interference filter, an optical integrator (fly eye lens) and an aperture stop (σ-stop). The fly eye lens is, though not illustrated, disposed an in-plane direction perpendicular to an optical axis AX so that its reticle-side focal place coincides substantially with a Fourier transform plane (pupil conjugate plane) of a reticle pattern. Disposed also in the vicinity of the second focal point is a shutter (e.g., 4-blade rotary shutter) 37 for closing and opening a light path of the illumination light IL with the aid of a motor 38. Note that the illumination light source 1 for an exposure may involve the use of, in addition to the mercury lamp generating emission-lines, laser sources such as KrF, ArF excimer leasers, or a metal vapor laser and a YAG laser which produce higher harmonics.

Now, the illumination light (i-line, etc.) emitted from the illumination optical system 3 has a wavelength to photosensitize a resist layer. A large proportion of the illumination light IL is reflected by a beam splitter 4 and reaches a mirror 8 via relay lenses 5, 7 and a variable field stop (reticle blind) 6. The illumination light IL is further reflected downward substantially in the perpendicular direction. Thereafter, a pattern area PA on a reticle R is illuminated with the illumination light IL with substantially uniform illuminance through a main condenser lens 9. A surface of the reticle blind 6 has a conjugate relationship (imagery relationship) to the reticle R. Hence, a plurality of movable blades constituting the reticle blind 6 is driven by a drive system 36. A size and a shape of the opening thereof are thereby varied. It is therefore possible to arbitrarily set an illumination field of view of the reticle R.

Figure 4A:
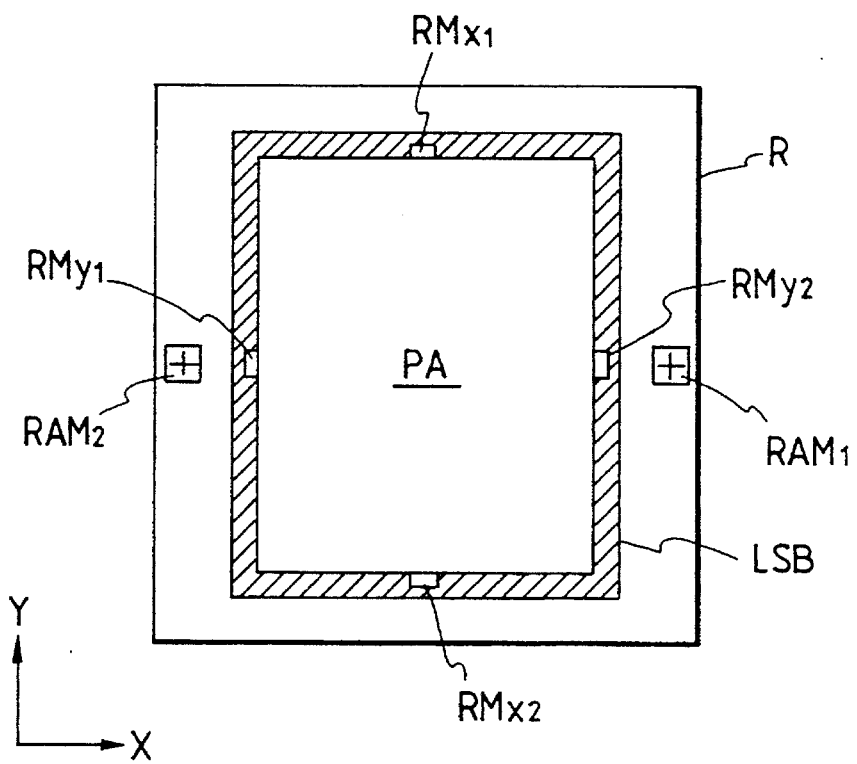
FIG. 4A is a view showing a geometry of a reticle used in a first embodiment.
Figure 4B:
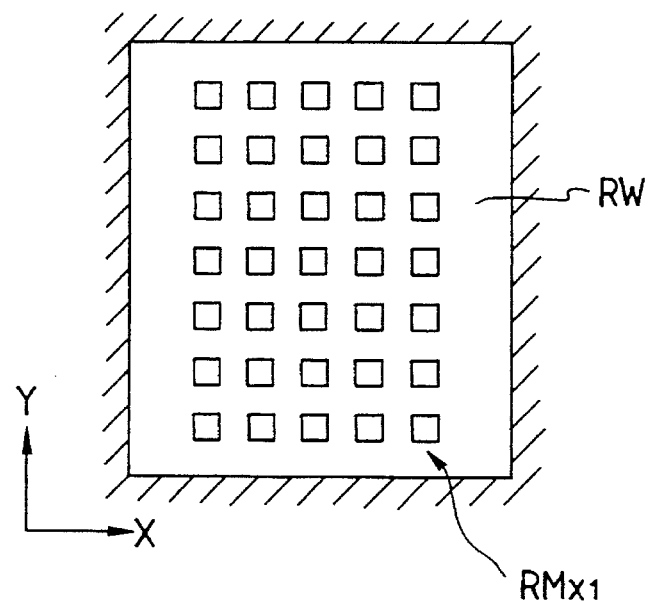
FIG. 4B is a view illustrating a specific layout of reticle marks.

FIG. 4A is a view showing a specific configuration of the reticle R. Four reticle marks $RM_{x1}$, $RM_{x2}$, $RM_{y1}$, $RM_{y2}$ are formed substantially at the centers of four sides of the pattern area PA surrounded by a light shielding band LSD. These reticle marks are formed as latent images on the resist layer. In this embodiment, it is assumed that the reticle marks be employed in common as alignment marks when aligned with a shot area. The reticle marks are also formed the same, and the explanation is herein emphasized on the mark $RM_{x1}$. As illustrated in FIG. 4B, the alignment mark $RM_{x1}$ is configured such that a five lines of diffraction grating marks (multi marks) each consisting of 7 dot marks arranged in a Y-direction are arranged in an X-direction at a predetermined interval. The alignment mark is composed of a light shielding substance such as chrome, etc. in a transparent window RW provided in the light shielding band LSB. Further, the reticle R is formed with two alignment marks $RAM_1$, $RAM_2$ arranged in a face-to-face relationship in the vicinity of the outer periphery thereof. Each of the alignment marks $RAM_1$, $RAM_2$ is shaped as a cross light shielding mark and employed for an alignment (with respect to the optical axis AX) of the reticle R.

The reticle R is placed on a reticle stage RS capable of making micromotions in the optical-axis direction of the projection optical system 13 through a motor 12. The reticle stage RS is also capable of making microrotations and two-dimensional movements within the horizontal plane. Fixed to an edge of the reticle stage RS is a movable mirror 11m for reflecting laser beams emitted from a laser light wave interference length measuring device (interferometer) 11. A two-dimensional position of the reticle stage RS is detected by the interferometer 11 all the times with a resolving power on the order of, e.g., 0.01 μm. Reticle alignment (RA) systems 10A, 10B work to detect the two alignment marks (cross marks $RAM_1$, $RAM_2$ in FIG. 4A) formed in the vicinity of the outer periphery of the reticle R. Based on signals transmitted from the RA systems 10A, 10B, a micromotion of the reticle stage RS is caused, thereby positioning the reticle R so that the central point of the pattern area PA coincides with the optical axis AX.

Figure 5A:
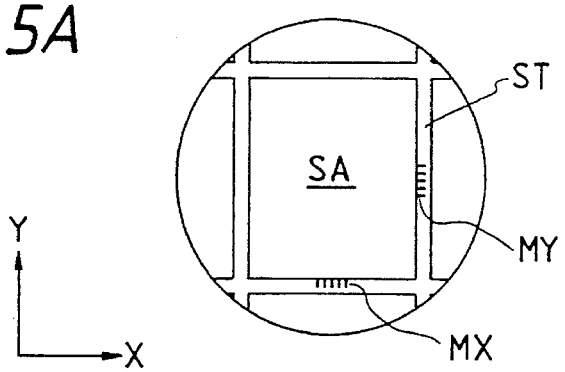
FIG. 5A is a view illustrating an appearance of one shot area on a wafer.
Figure 5B:
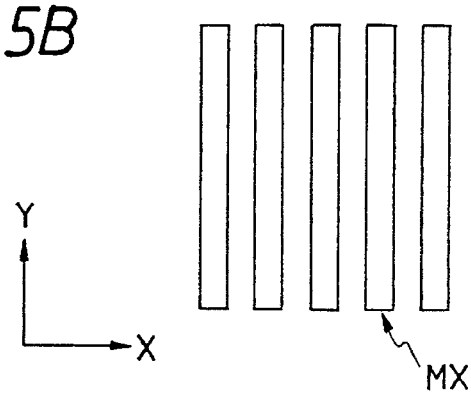
FIG. 5B is a view illustrating a specific layout of wafer marks shown in FIG. 5A.

Now, the illumination light IL passing through the pattern area PA falls on the projection optical system 13 that is telecentric on both sides. The projection optical system 13 reduces a projection image of a circuit pattern of the reticle R by a factor of 5. A resist layer is formed on the surface of a wafer W. The projection image is so projected (formed) as to be superposed on one shot area on a wafer W held so that its surface substantially coincides with a best image-forming plane. FIG. 5A is a view showing a layout relationship of the one shot area SA on the wafer W versus wafer marks MX, MY attached thereto. FIG. 5B is a view illustrating a geometry of the wafer mark MX. Turning to FIG. 5A, the shot area SA is surrounded with street lines ST. The alignment marks MX, MY are formed substantially at the centers of the street lines ST of two side orthogonal to each other. Each of the alignment marks MX, MY is a one-dimensional diffraction grating mark, wherein recesses or protrusions are formed in or on its base. The wafer mark MX has, as illustrated in FIG. 5B, such a geometry that five bar marks extending in the Y-direction are arranged at a predetermined pitch in the X-direction (measuring direction).

The wafer W is vacuum-adsorbed by a wafer holder (unillustrated) capable of making microrotations. The wafer stage WS is so constructed at to make two-dimensional movements by a step-and-repeat method through a motor 16. When finishing a transfer exposure of the reticle R on the shot area on the wafer W, the wafer stage WS is stepped up to a next shot position.

Further, the wafer stage WS is designed to be finely movable in a direction parallel to the optical axis AX of the projection optical system 13 (Z-direction) by a motor 16. The specific construction of the wafer stage WS is disclosed, for example, in U.S. Pat. No. 4,770,531. A movable mirror 15m for reflecting the laser beam coming from the interferometer 15 is fixed to an edge of the wafer stage WS. A two-dimensional position of the wafer stage is detected by the interferometer 15 always with a resolving power on the order of, e.g., 0.001 μm.

Figure 6:
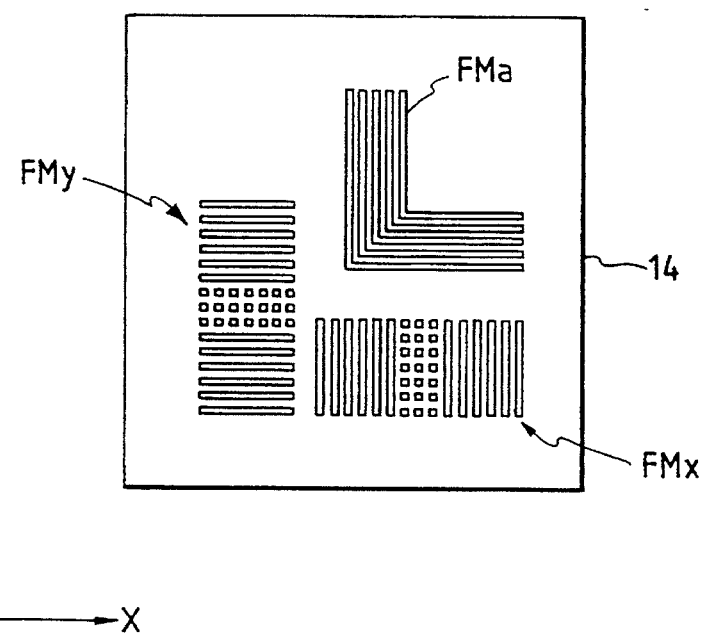
FIG. 6 is a view showing one example of a specific configuration of a fiducial member.

Further, a fiducial member (glass substrate) 14 has a fiducial mark used for a baseline measurement. The fiducial member 14 is so mounted on the wafer stage WS as to coincide substantially with a surface position of the wafer W. The fiducial member 14 is, as illustrated in FIG. 6, formed with a set of slit patterns FMa and two sets of fiducial patterns (duty ratio is 1:1) FMx, FMy as a fiducial mark. The slit patterns FMa consist of five light-transmitting L-shaped patterns. The fiducial patterns FMx, FMy are formed of light reflecting chrome. The fiducial pattern FMx includes three lines of diffraction grating marks each having seven dot marks arranged in the Y-direction and twelve lines of bar marks extending in the Y-direction. The twelve lines of bar marks are arranged in the X-direction, with the three lines of diffraction grating marks centrally interposed therebetween. Note that the fiducial pattern FMy is configured also the same as the pattern FMx, and, therefore, its explanation is omitted herein.

Now, the slit pattern FMa is so configured as to be illuminated from downward (interior of the wafer stage) with the illumination light (exposure light) guided via an optical fiber (not shown) to a portion under the fiducial member 14. The illumination light penetrating the slit pattern FMa forms a projection image of the slit pattern FMa on a rear surface (pattern surface) of the reticle R through the projection optical system 13. Further, the illumination light traveling through the reticle R is, after penetrating the beam splitter 4 via the condenser lens 9 and the relay lenses 5, 7, received by a photoelectric detector 35 disposed in close proximity to the pupil conjugate plane of the projection optical system 13. The photoelectric detector 35 outputs, to a main control system 18, a photoelectric signal SS corresponding to an intensity of the illumination light. Hereafter, the optical fiber, the fiducial member 14 and the photoelectric detector 35 are in combination termed an ISS (Imaging Slit Sensor) system.

Provided also, as shown in FIG. 1, is an imaging characteristic correction unit 19 capable of adjusting imaging characteristics of the projection optical system 13. The correction unit 19 in this embodiment corrects the imaging characteristics, e.g., a projection magnification and a distortion of the projection optical system 13. This correction is done by independently driving (making a parallel movement or tilting with respect to the optical axis AX) some lens elements constituting the projection optical system 13, especially a plurality of lens elements closer to the reticle R by use of a piezo-electric element or the like. Note that a concrete configuration and actions of the correction unit 19 are disclosed in, e.g., U.S. Pat. No. 5,117,255.

Next, two pieces of alignment sensors mounted in the thus constructed apparatus will be explained. An off-axis alignment sensor (Field Image Alignment; FIA system) guides the light generated by a halogen lamp 20 to an interference filter 23 via a condenser lens 21 and an optical fiber 22. In the interference filter 23, rays of light of a photosensitive wavelength zone and an infrared wavelength zone of the resist layer are cut off. The light passing through the interference filter 23 falls on a telecentric objective lens 27 via a lens system 24, a beam splitter 25, a mirror 26 and a field stop BR. The light is further reflected by a prism (mirror) 28 fixed to a portion peripheral to a lower part of a lens barrel so as not to light-shield an illumination field of view of the projection optical system 13. The wafer W is thus irradiated with the light substantially in the perpendicular direction.

The light from the objective lens 27 falls on a partial area including the wafer mark (base mark) MX. the light reflected by this area is guided to an index plate 30 via the prism 28, the objective lens 27, the field stop BR, the mirror 26, the beam splitter 25 and a lens system 29. The index plate 30 is herein disposed within a plane conjugate to the wafer W through the objective lens 28 and the lens system 29. An image of the alignment mark MX on the wafer is formed within a transparent window of the index plate 30. The index plate 30 is further formed with, as an index mark, two lines of rectilinear marks extending in the Y-direction but disposed at a predetermined spacing in the X-direction within the transparent window thereof. The light penetrating the index plate 30 is led to an imaging device (CCD camera or the like) via relay lens systems 31, 33 and a mirror 32. The image of the alignment mark MX and an image of the index mark are formed on the light receiving surface of the imaging device 34. An image signal SV coming from the imaging device 34 is transmitted to the main control system 18, wherein an X-directional position (coordinate value) of the alignment mark MX is calculated. Note that another FIA (Y-FIA system), though not illustrated in FIG. 1, for detecting a Y-directional mark position is, it is assumed, provided in addition to the FIA system (X-FIA system).

Next, an alignment sensor 17 based on the TTL system will be explained with reference to FIG. 2. The alignment sensor 17 is a version in which optical members of the LIA and LSA systems are combined by using them in common at the maximum. A concrete construction thereof is disclosed in U.S. Pat. No. 5,151,750 and therefore briefly explained herein.

Referring to FIG. 2, a laser beam emitted from a light source (He-Ne laser, etc.) 40 is split by a beam splitter 41. The beam reflected therefrom is incident on a first beam shaping optical system (LIA optical system) 45 via a shutter 42. On the other hand, the beam penetrating the beam splitter 41 is incident on a second beam shaping optical system (LSA optical system) via a shutter 43 and a mirror 44 as well. Hence, the LIA and LSA systems are usable in such a manner as to switch over them by properly propelling the shutters 42, 43.

Now, an LIA optical system 45 includes two acousto-optic modulators. Two beams provided with a predetermined frequency difference Δf are emitted therefrom so that the beams are substantially symmetric with respect to the optical axis thereof. The two beams emitted from the LIA optical system 45 are further incident on a beam splitter 49 via a mirror 47 and a beam splitter 48. The two beams passing therethrough fall on a reference diffraction grating 55 fixed to an upper part of the apparatus at a predetermined cross angle from two directions different from each other via a lens system (inverse Fourier transform lens) 53 and a mirror 54, thereby forming an image (intersection). A photoelectric detector 56 receives beams of interference light of diffraction light beams traveling through the reference diffraction grating 55 and generated substantially in the same direction. The photoelectric detector 56 outputs a sine-wave-like photoelectric signal SR corresponding to an intensity of the diffraction light to the main control system 18, i.e., an LIA calculation unit 58.

On the other hand, the two beams reflected by the beam splitter 49 intersect each other once at a field stop 51 through an objective lens 50. The two beams are thereafter incident on the projection optical system 13 via a mirror $M_2$ (illustration of a mirror $M_1$ in FIG. 1 is omitted). Further, the two beams are once condensed spotwise in symmetry with respect to the optical axis AX on the pupil plane of the projection optical system 13. After this, the beams turn out parallel beams each inclined at a symmetric angle with the optical axis AX being interposed therebetween in the pitch direction (Y-direction) of the alignment mark MY on the wafer W. The parallel bemas are incident on the wafer mark MY at a predetermined cross angle from two directions different from each other. One-dimensional interference fringes moving at a velocity corresponding to the frequency difference $\Delta f$ are thereby formed on the wafer mark MY. Beams of ±1st-order diffraction light (interference light) generated in the same direction from the above-mentioned mark, e.g., in the optical-axis direction are received by the photoelectric detector 52 through the projection optical system 13, the objective lens 50, etc. The photoelectric detector 52 outputs, to the LIA calculation unit 58, a sine-wave-like photoelectric signal SDw corresponding to a change-of-brightness period of the interference fringes. The LIA calculation unit 58 calculates a positional deviation quantity on the basis of a phase difference in terms of waveform between the two photoelectric signals SR, SDw. At the same time, the LIA calculation unit 58 obtains coordinate positions of the wafer stage when a positional deviation quantity is zeroed by use of position signals PDs transmitted from the interferometer 15. Information thereof is outputted to an alignment data storing unit 61 (FIG. 3).

The LSA optical system 46 also includes a beam expander and a cylindrical lens. Beams outgoing therefrom fall on the objective lens 50 via the mirror 48 and the beam splitter 49. The beams are once converged slitwise by the field stop 51 through the objective lens 50. The converged light is incident on the projection optical system 13 via a mirror $M_2$. The light, after traveling through substantially the center of the pupil plane thereof, turns out elongate band-like spot beams formed on the wafer W, the spot beams extending within an image field in the X-direction and traveling along the optical axis AX. When the spot beams and the wafer mark (diffraction grating mark) are relatively moved in the Y-direction, the beams generated from the wafer mark are received by the photoelectric detector 52 through the projection optical system 13, the objective lens 50, etc. The photoelectric detector 52 photoelectrically detects only, e.g., ±1st- through 3rd-order diffraction beams among the beams of light generated from the wafer mark. The photoelectric detector 52 outputs a photoelectric signal SDi corresponding to an intensity of this light to the main control system 18, i.e., the LSA calculation unit 57. The LSA calculation unit 57 inputs also a position signal PDs from the interferometer 15. The LSA calculation unit 57 performs sampling of the photoelectric signals SDi in synchronization with up-down pulses generated per unit movement quantity of the wafer stage WS. Further, respective sampling values are converted into digital values and stored in a memory in the sequence of addresses. Thereafter, a Y-directional position of the wafer mark is calculated by a predetermined arithmetic process. Information thereof is outputted to the alignment data storing unit 61.

By the way, in advance of an overlay exposure (main exposure) in accordance with this embodiment, the reticle mark (diffraction grating mark) is exposed on the wafer W by its being irradiated With the exposure light. Its latent image is thereby formed on the resist layer. A sensor for detecting this latent image principally involves the use of the LSA system. Accordingly, the LSA system and the LSA calculation unit 57 detect the latent image of the reticle mark absolutely in the same way with the wafer mark (base mark) and outputs the positional information thereof to the alignment data storing unit 61. Incidentally, it is assumed that there is provided, though not illustrated in FIG. 1, another TTL system alignment sensor (A-LIA and X-LSA systems) for detecting an X-directional mark position in addition to the alignment sensor (Y-LIA and Y-LSA systems) having the above-mentioned configuration.

An auto focusing mechanism for setting the surface of the wafer W at the best focus position of the projection optical system 13 is provided in the projection exposure apparatus of FIG. 1. This auto focusing mechanism has a focus position detecting system (hereinafter referred to as the AF sensor) 81 of the oblique incident light type shown in FIG. 23, and a Z stage finely movable in the direction of the optical axis which constitutes the wafer stage WS. The AF sensor 81 of the oblique incident light type, as disclosed, for example, in U.S. Pat. Nos. 4,558,949 and 4,650,983, detects the position of the surface of the wafer W in the direction of the optical axis of the projection optical system 13 (hereinafter referred to as the focus position. The AF sensor 81 of the oblique incident light type will hereinafter be described with reference to FIG. 23. In FIG. 23, the same members as those in FIG. 1 are given the same reference characters.

In FIG. 23, the AF sensor 81 is comprised of a light transmitting system 81a (from an illuminating system 82a to a condensing objective lens 82c) and a light receiving system 81b (from a condensing objective lens 82d to a photoelectric detector 82h). In the light transmitting system 81a, a slit-like opening pattern is formed in the front surface of the illuminating system 82a (the surface conjugate with the surface of the wafer). Detection light passed through the opening pattern (for example, light insensitive to the resist on the wafer W) is applied to the wafer W (or the fiducial member 14) obliquely to the optical axis AX of the projection optical system 13 via the mirror 82b and the condensing objective lens 82c, whereby a slit pattern image is formed and projected on the surface of the wafer. The detection light reflected by the surface of the wafer arrives at the photoelectric detector 82h via the light receiving objective lens 82d, the plane parallel glass 82e, the vibratory mirror 82f and the imaging lens 82g, and the slit pattern image is re-formed on the light receiving surface thereof (exactly, the slit plate). In the photoelectric detector 82h, the light passed through the slit plate thereof is photoelectrically converted and a detection signal obtained thereby is synchronously rectified by the driving signal of the vibratory mirror 82f, and a focus signal which is the detection signal after this synchronous rectification is supplied to the system controller 65 of FIG. 3.

In this case, the lengthwise direction of the slit pattern image on the surface of the wafer W is a direction perpendicular to the plane of the drawing sheet of FIG. 23, and when the surface of the wafer W is displaced in Z-direction, the slit pattern image on the light receiving surface of the photoelectric detector 82h is displaced in X-direction. Accordingly, the focus signal outputted from the photoelectric detector 82h becomes a signal which varies substantially linearly relative to the focus position of the surface of the wafer W within a predetermined range. Therefore, the focus position of the surface of the wafer W can be detected from that focus signal. Also, the plane parallel glass 82e in the light receiving system 81b is rotated about an axis perpendicular to the plane of the drawing sheet of FIG. 23, whereby the position of the slit pattern image on the light receiving surface of the photoelectric detector 82h is displaced in X-direction. The system controller 65 of FIG. 3 sets the angle of rotation of the plane parallel glass 82e through a driving system 83. As will be described later, when the best focus position of the projection optical system 13 has been determined, the plane parallel glass 82e is rotated with the surface of the wafer W or the fiducial member 14, for example, set in its best focus position, whereby the center of the slit pattern image is brought into coincidence with the center of the opening in the light receiving surface of the photoelectric detector 82h. This means that the focus signal is set, for example, at the zero cross point, and by this, the calibration of the AF sensor 81 is effected.

Next, the main control system 18 for generalization-controlling the apparatus will be explained with reference to FIG. 3. In accordance with this embodiment, the main control system 18 is constructed of components starting from the LSA calculation unit 57 to a system controller 65 in the sequence of numerals.

Turning to FIG. 3, an FIA calculation unit 59 calculates a positional deviation quantity of an image of the wafer mark with respect to an index mark by a predetermined arithmetic process on the basis of a waveform of the image signal SV given from the imaging device 34. The FIA calculation unit 59 inputs also the position signal PDs transmitted from the interferometer 15. Obtained are coordinate positions of the wafer stage WS when the wafer mark image is located exactly at the center of the index mark (the positional deviation quantity is zeroed). Information thereof is outputted to the alignment data storing unit 61. Further, an ISS calculation unit 60 input also the position signal PDs from the interferometer 15 together with the photoelectric signal SS outputted from the photoelectric detector 35 when the fiducial member 14 (slit pattern FMa) and the reticle R are relatively moved. Then, the photoelectric signals SS undergo sampling in synchronization with the up-down pulses generated per unit movement quantity. The respective sampling values are converted into digital values and stored in the memory in the sequence of addresses. Calculated thereafter is an X- or Y-directional position (coordinate position on the rectangular coordinate system XY defined by the interferometer 15) of the reticle mark by the predetermined arithmetic process. Information thereof is outputted to the alignment data storing unit 61.

Moreover, the alignment data storing unit 61 is capable of inputting pieces of mark positional information (containing the latent image position) given respectively from the four calculation units 57–60. An EGA calculation unit 62 executes a variety of arithmetic operations by use of the positional information given from the four calculation units 57–60. Calculated results thereof are transferred to a storing unit 63 and the system controller 65. As one example, array coordinate values of the shot areas on the wafer W are calculated based on the mark position information stored in the alignment data storing unit 61 by a statistic calculation method. In advance of calculating the array coordinate values described above, the EGA calculation unit 62 calculates calculation parameters, i.e., offsets (in the X- and Y-directions) of the wafer central position, degrees of wafer expansion/contraction (in the X- and Y-directions), a residual rotational error of the wafer and a perpendicularity of the wafer stage or a perpendicularity of the shot array (transform matrices A, which will be mentioned later). Pieces of information thereof are also stored in the storing unit 63.

Further, a shot map data unit 64 stores a design exposure position (array coordinate value Dn) of the shot area to be exposed on the wafer, and the number and positions of the shot areas which are to undergo a sample alignment (hereinafter called a sample shot). The shot map data unit 64 also stores the number and positions of the reticle mark latent images to be formed. These items of data are transferred to the EGA calculation unit 62 and the system controller 65 as well. Based on the respective items of data given above, the system controller 65 also determines a series of procedures for controlling the movements of the wafer stage WS during the alignment, the formation of the latent image and the exposure by the step-and-repeat method. A wafer stage controller 66 and a reticle stage controller 67 are also shown in FIG. 3.

Note that the numbers and positions of the sample shots and of the latent image formations are predetermined to satisfy each of an alignment accuracy, a calculation accuracy of the array offsets ($\Delta Ox$, $\Delta Oy$) which will be stated later and a throughput. The operator sets beforehand these items of data in the shot map data unit 64 by use of an input unit (unillustrated keyboard or the like). Alternatively, the system controller 65 may be constructed to automatically select and set the data in accordance with a predetermined program. Further, the data described above may be determined empirically or by a test and simulation depending on, e.g., the wafer, the base, a type of the resist (further its film thickness) and processing conditions (heating temperature, time, etc.) in the wafer processing step or a type of the alignment sensors employed for detecting a latent image and a base mark. The data may also be made different for each of the unit number of wafers or per lot.

Also, the AF sensor 81 and the driving system 83 are connected to the system controller 65. The system controller 65 sets the angle of rotation of the plane parallel glass 82e in the light receiving system 81b of the AF sensor 81 which is shown in FIG. 23. During the calibration of the AF sensor 81, the system controller 65 sets the angle of rotation of the plane parallel glass 82e through the driving system 83 so that in the best focus position of the projection optical system 13 determined as will be described later, the focus signal outputted from the light receiving system 81b may become a zero point. During the exposure onto the wafer W, the system controller 65 finely moves the Z stage in the wafer stage WS in Z-direction in conformity with the focus signal from the AF sensor 81, thereby effecting the auto focusing of the wafer W.

Figure 7:
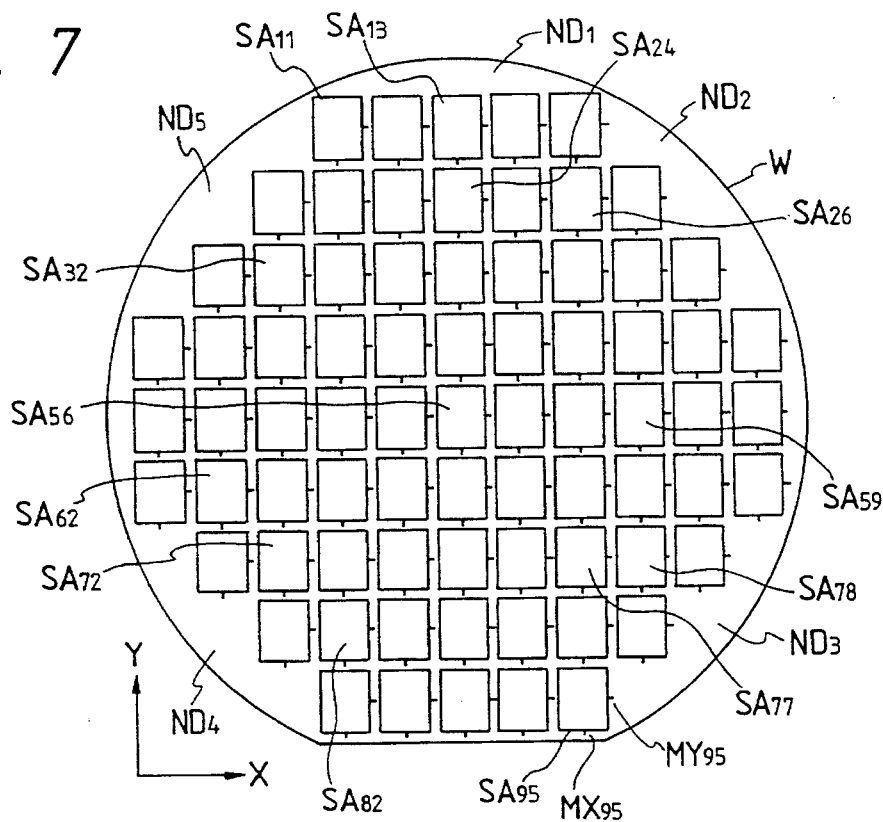
FIG. 7 is a view illustrating an appearance of the shot areas arrayed on the wafer.

The positioning method in this embodiment will next be discussed. In accordance with the present embodiment, an EGA alignment is conducted by using the FIA system during the overlay exposure (main exposure). An LSA system is, it is assumed, used for detecting a latent image. Further, as illustrated in FIG. 7, a plurality of circuit patterns (shot areas SAij) and wafer marks (MXij, MYij) have already been formed in matrix on the wafer W. A resist is further, it is also assumed, coated on its surface with a substantially uniform thickness (approximately 0.5–2 μm). Referring to FIG. 7, the shot area SAij is a shot area located in an i-th row (shot row arranged i-th from above in the X-direction within the drawing) and in a j-th column (shot column arranged j-th from left in the Y-direction within the drawing). The wafer marks MXij, MYij are also wafer marks located the same.

Now, in the stepper depicted in FIGS. 1 to 3, the reticle R (FIG. 4A) is loaded on the reticle stage RS. A rough alignment is effected by two RA systems 10A, 10B so that the center of the reticle R coincides with the optical axis AX. The reticle R is thereafter vacuum-adsorbed by the reticle stage RS. Further, the main control system 18 performs a fine alignment of the reticle R by using the fiducial member 14. More specifically, four reticle marks $RM_{x1}$, $RM_{x2}$, $RM_{y1}$, $RM_{y2}$ are respectively detected by use of the slit pattern FMa. The EGA calculation unit 62 calculates positional deviation quantities of the reticle R in X- and Y-directions as well as in the rotating direction with respect to the rectangular coordinate system XY defined by the interferometer 15. These quantities are calculated from the four coordinate values calculated by the ISS calculation unit 60. Then, the system controller 65 causes the stage controller 67 to drive the reticle stage RS while monitoring outputs of the interferometer 11 so that the positional deviation quantities are substantially zeroed. As a result, the reticle R is precisely positioned with respect to the optical axis AX, thus finishing the reticle alignment.

Next, the main control system 18 executes a baseline measurement of the X-FIA systems 20–34 by use of the fiducial member 14. To start with, the reticle mark $RM_{x1}$ is detected by employing the slit pattern FMa. The ISS calculation unit 60 outputs a coordinate value of this reticle mark to the alignment data storing unit 61. Thereafter, a fiducial pattern FMx is detected by using the X-FIA system. The FIA calculation unit 59 outputs a coordinate value thereof to the storing unit 61. The EGA calculation unit 62 obtains a baseline $\Delta Bx$ in the X-direction from the two coordinate values stored in the storing unit 61. This baseline is stored in the storing unit 63. Note that the baseline measurement is also performed in the Y-FIA system (not shown), and its value $\Delta By$ is stored in the storing unit 63.

Further, after the baseline measurement stated above, the first in-lot wafer W (FIG. 7) is loaded on the wafer stage WS. The system controller 65 executes a prealignment of the wafer W by using the two FIA systems. At the first onset, the Y-FIA system detects wafer marks $MY_{72}$, $MY_{78}$ of two shot areas, e.g., shot areas $SA_{72}$, $SA_{78}$ in FIG. 7 which are formed substantially in bilaterally symmetric positions with respect to the wafer center (shot center of an area $SA_{56}$) in the vicinity of the outer periphery of the wafer W. The FIA calculation unit 59 calculates Y-directional positions (coordinate values) thereof. On the other hand, the X-FIA system detects a wafer mark $MX_{24}$ of a shot area, e.g., a shot area $SA_{24}$ in FIG. 7 located at a substantially equal distance from the two shot areas $SA_{72}$, $SA_{78}$ in the vicinity of the outer periphery of the wafer W. The FIA calculation unit 59 calculates an X-directional position thereof.

The EGA calculation unit 62 calculates the positional deviation quantities (including a rotational error) with respect to the rectangular coordinate system XY on the basis of the mark positional information of the three shot areas which has been stored in the alignment data storing unit 61. Thereafter, the system controller 65 causes the stage controller 66 to drive the wafer stage WS so that these positional deviation quantities are substantially zeroed. The prealignment of the wafer W is thereby completed. As a result, the relative offset between the reticle R and the wafer W (shot areas SAij) is corrected with an accuracy on the order of 1 μm or less.

Next, according to the method disclosed in U.S. Pat. No. 4,780,617 stated before, array coordinate values (Fgx, Fgy) of all the shot areas SAij on the wafer W are calculated. To begin with, the system controller 65 executed a sample alignment by using the two FIA systems. Hereat, data (positions and the number) on the sample shots are read from the shot map data unit 64. The wafer stage WS is stepped in accordance with these items of data, i.e., the design array coordinate values (Dx, Dy) of the sample shots and the baselines $\Delta Bx$, $\Delta By$ stored in the storing unit 63. The wafer marks MXij, MYij of the sample shots are thereby respectively sequentially positioned with respect to each of the X-FIA and Y-FIA systems. It is herein assumed that m-pieces (m≧3) of shot areas located in the vicinity of the outer periphery of the wafer e.g., seven shot areas $SA_{13}$, $SA_{26}$, $SA_{32}$, $SA_{59}$, $SA_{62}$, $SA_{77}$, $SA_{82}$ in FIG. 7 are set as the sample shots in this embodiment among the plurality of shot areas ij on the wafer W. In consequence, the FIA calculation unit 59 calculates the mark positions by predetermined waveform processing. These pieces of positional information are transferred as array coordinate values (Mgx, Mgy) to the alignment data storing unit 61.

Herein, in this embodiment, positions of two sets of wafer marks MXij, MYij (in the X- and Y-directions) of the seven shot areas SAij are measured. There are, however, rejected unmeasurable marks or marks (hereinafter termed defective marks) in which the measured values thereof are extremely different from the design value. Only remaining mark positions may be employed. At this time, the shot areas themselves which have the defective marks may be rejected. Further, the shot areas in the vicinity of the shot areas to be rejected are selected as substitute shots, and mark positions thereof may be measured. Moreover, in the substitute shots, any one of the wafer marks MXij, MYij corresponding to the defective mark may be measured. For instance, if a wafer mark $MX_{82}$ of the shot area $SA_{82}$ is defective, a shot area $SA_{73}$ is selected as a substitute shot. Positions of both of wafer marks $MX_{73}$, $MY_{73}$ or the position of only the mark $MX_{73}$ may be measured. Further, the shot area in which the positions of both of the marks MXij, MYij are measured is conceived as a sample shot. It is required in this embodiment that the mark measurements be conducted with respect to at least three sample shots. Note that only one mark (e.g., in the X-direction) in one shot area is measured, and the other mark (in the Y-direction) is measured in the substitute shot therefor. In this case, they may be counted while being conceived as one sample shot. Further, two wafer mark MXij, MYij are attached to one shot area SAij in accordance with this embodiment. It is therefore required in the following discussion that at least three shot areas be selected as sample shots in the EGA system. For determining transform matrices Ag, Og in the EGA system, however, at least six wafer marks (precisely, three or more marks both in the X-direction and in the Y-direction) may be selected as specified marks from the multiplicity of wafer marks on the wafer. There is certainly no necessity for being particular about the number of sample shots. This is the same with EGA employing latent image marks that will be mentioned later.

Now, the EGA calculation unit 62 determines a regularity of the shot array on the wafer W to be aligned by the step-and-repeat method. This determination is made based on the measured array coordinate values (Mgx, Mgy) of the seven sample shots which have been stored in the alignment data storing unit 61 and the design array coordinate values (Dx, Dy) stored in the shot map data unit 64. Namely, the transform matrices Ag, Og in the following mapping relational formula (1) (determinant Mg=Ag·D+Og) are determined. However, the transform matrices Ag, Og in the above-mentioned relational formula contain a residual rotational error $\theta_g$, a perpendicularity $\omega_g$, scaling errors Rgx, Rgy and offset errors Ogx, Ogy as parameters. The transform matrix Ag is configured by 2 rows and 2 columns, while the matrix Og is configured by 2 rows and 1 column.

$$\begin{bmatrix} Mgx \\ Mgy \end{bmatrix} = Ag \begin{bmatrix} Dx \\ Dy \end{bmatrix} + Og \quad (1)$$

Note that the transform matrices Ag, Og are expressed the following formulae 2 and 3.

$$Ag = \begin{bmatrix} a_g & c_g \\ b_g & d_g \end{bmatrix} \quad (2)$$

$$= \begin{bmatrix} \cos\theta_g & -\sin\theta_g \\ \sin\theta_g & \cos\theta_g \end{bmatrix} \begin{bmatrix} 1 & -\tan\omega_g \\ 0 & 1 \end{bmatrix} \begin{bmatrix} Rgx & 0 \\ 0 & Rgy \end{bmatrix}$$

$$= \begin{bmatrix} Rgx \cdot \cos\theta_g - Rgx(\cos\theta_g \cdot \tan\omega_g + \sin\theta_g) \\ Rgy \cdot \sin\theta_g \; Rgy(-\sin\theta_g \cdot \tan\omega_g + \cos\theta_g) \end{bmatrix}$$

$$Og = \begin{bmatrix} e_g \\ f_g \end{bmatrix} = \begin{bmatrix} Ogx \\ Ogy \end{bmatrix} \quad (3)$$

Herein, residual terms ($\epsilon Xg, \epsilon Yg$) exist with respect to the measuring array coordinate values (Mgx, Mgy) and the design array coordinate values (Dx, Dy) in the shot areas on the wafer. The above-mentioned formula (1) is rewritten into the following formula (4):

$$\begin{bmatrix} Mgx \\ Mgy \end{bmatrix} = Ag \begin{bmatrix} Dx \\ Dy \end{bmatrix} + Og + \begin{bmatrix} \epsilon Xg \\ \epsilon Yg \end{bmatrix} \quad (4)$$

Hence, the EGA calculation unit 62 arithmetically determines values of the respective parameters $a_g-f_g$ of lo the transform matrices Ag, Og so that the above-described residual terms (i.e., a residual sum of squares) are minimized. Note that the thus calculated transform matrices Ag, Og are stored in the storing unit 63. Further, the EGA calculation unit 62 calculates array coordinate values (Fgx, Fgy) of all the shot areas SAij on the wafer W in accordance with the formula (1) given above. The EGA calculation unit 62 transfers a result of this calculation to the storing unit 63 as well as to the system controller 65.

Figure 8:
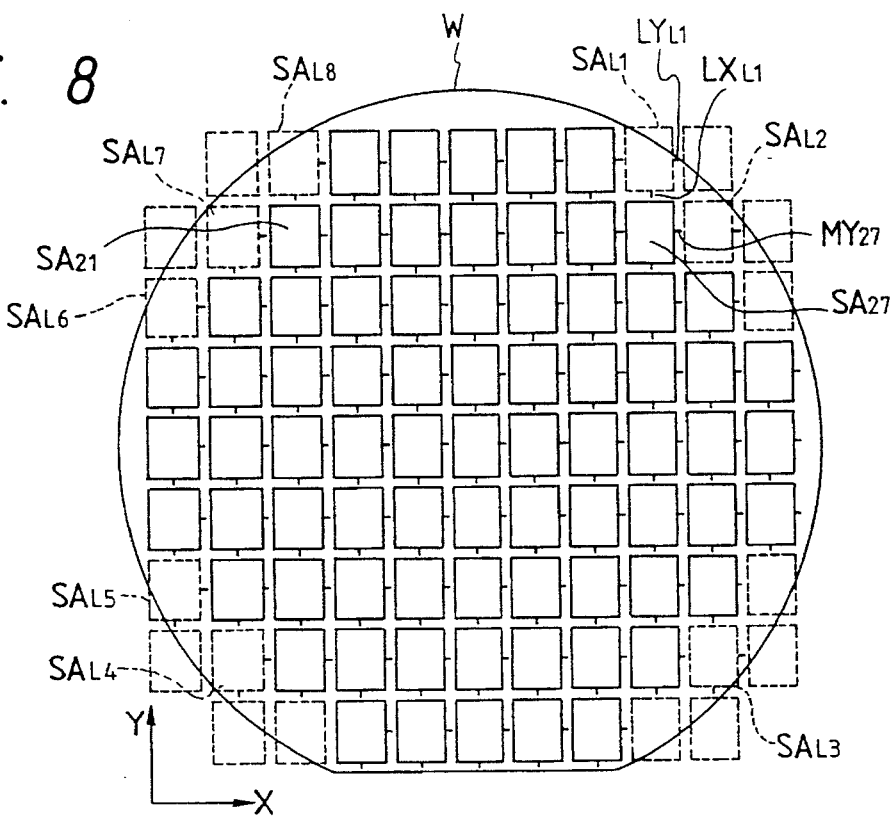
FIG. 8 is a view of assistance in explaining the positioning method in detail in accordance with first embodiment.

Herein, in this embodiment, as will be mentioned later, the latent images of the reticle marks are formed in, e.g., domains $ND_1-ND_5$ in FIG. 7 in which the circuit patterns and the alignment marks are not formed on the base in the vicinity of the outer periphery of the wafer W. These unexposed areas are those on which the circuit patterns are not transferred from the beginning. It is because some shot areas are, as indicated by dotted lines in FIG. 8, broken off on the wafer W. Then, in accordance with this embodiment, for example, eight virtual shot areas (hereinafter called virtual shots) $SA_{L1}-SA_{L8}$ shown in FIG. 8 are preset in totally n-pieces (n≧3) of the non-exposed domains $ND_2-ND_5$. Besides, design array coordinate values with respect to each of these wight virtual shots $SA_{L1}-SA_{L8}$ are stored in the data unit 64. Then, when determining coordinate positions of the shot area SAij by the EGA system described above, array coordinate values (Fgx, Fgy) of the respective virtual shots $SA_{L1}-SA_{L8}$ are also calculated. A result of this calculation is transferred to the storing unit 63 and the system controller 65. Note that the wafer W shown in FIG. 8 is the same as the wafer illustrated in FIG. 7.

Incidentally, as discussed above, there are a series of actions from the step of obtaining the transform matrices Ag, Og (parameters $a_g-f_g$) by the least squares method by executing the sample alignment to the step of calculating the array coordinate values (Fgx, Fgy). These actions are hereinafter simply referred to as g-EGA. Further, only the transform matrices Ag, Og (parameters $a_g-f_g$) and the array coordinate values of the eight virtual shots may be calculated by g-EGA. By the way, the array coordinate values calculated by g-EGA are expressed by (Fgx, Fgy). The reason for this is that the calculative array coordinate values (Fgx, Fgy) do not necessarily coincide with the measuring array coordinate values (Mgx, Mgy) in all the shot areas on the wafer because of the application of the least squares method.

Next, the system controller 65 puts the wafer stage WS into a stepping action in accordance with the foregoing array coordinate values (Fgx, Fgy), especially the virtual shot array coordinate values. The reticle pattern (FIG. 4A) is thus exposed on each of the virtual shots $SA_{L1}-SA_{L8}$ in the non-exposed domains $ND_2-ND_5$ on the wafer W. At this time, the system controller 65 adjusts the field of view of illumination by propelling the reticle blind 6 beforehand so that only the reticle marks $RM_{x1}$, $RM_{y1}$ are irradiated with the exposure light IL. As a result, the images, i.e., latent images of the reticle marks $RM_{x1}$, $RM_{y1}$ are formed on the resist layer. When forming such latent images, an exposure quantity that is twice or three times a saturation energy of the resist to be used is given to the resist layer. Hereinafter, the latent images of the reticle marks $RM_{x1}$, $RM_{y1}$ concomitant with the virtual shot $SA_{L1}$ are termed $LX_{L1}$, $LY_{L1}$, respectively. Other virtual shots are, though not illustrated, the same.

Herein, the projection images of the reticle marks $RM_{x1}$, $RM_{y1}$, when reticle R is overlaid exactly on the shot area SAij, coincide (are overlaid on) with the wafer marks MXij, MYij. Note that the reticle marks $RM_{x1}$, $RM_{y1}$ may be disposed so that the projection images of the reticle marks $RM_{x1}$, $RM_{y1}$ and the wafer marks MXij, MYij are formed apart at predetermined spacings. Further, it is difficult to light-shield the areas other than the reticle marks $RM_{x1}$, $RM_{y1}$ by use of the reticle blind 6. Accordingly, for example, an auxiliary light shielding plate is disposed to light-shield the pattern area PA. The reticle marks $RM_{x2}$, $RM_{y2}$ may be light-shielded by the reticle blind 6. In this embodiment, however, the latent images are formed concomitantly with the virtual shot areas of the non-exposed domains $ND_2-ND_5$, and hence the entire reticle surface is allowed to be irradiated with the exposure light IL without light-shielding the areas other than the reticle marks $RM_{x1}$, $RM_{y1}$. On this occasion, the reticle mark $RM_{x2}$ or $RM_{y2}$ can be projected with respect to the wafer mark of the shot area adjacent to the virtual shot. For instance, when forming the latent image in the virtual shot $SA_{L2}$, the reticle mark $RM_{y2}$ is exposed in superposition on a wafer mark $MY_{27}$ of the shot area $SA_{27}$. For this reason, it is desirable that the reticle marks $RM_{x2}$, $RM_{y2}$ be light-shielded by the reticle blind 6.

Now, as explained earlier, when the latent images of the reticle marks $RM_{x1}$, $RM_{y1}$ are formed, the system controller 65 selects an alignment sensor optimal to the detection of the latent images, particularly the LSA system in this embodiment. The latent image marks are detected by employing the two LSA systems. At the first onset, the system controller 65 reads the data (positions and the number) about the virtual shots from the storing unit 63. The system controller 65 brings the wafer stage WS into the stepping action in accordance with the calculative array coordinate values (Fgx, Fgy) of the respective virtual shots. The respective spot beams of the X-LSA system and the Y-LSA system and two latent image marks ($LX_{L1}$, $LY_{L1}$) are relatively moved per virtual shot. As a result, the LSA calculation unit 57 calculates the mark positions by the predetermined waveform processing. Pieces of positional information are transferred as array coordinate values (Mtx, Mty) to the alignment data storing unit 61.

Herein, when detecting the latent images also in this embodiment, the unmeasurable marks or those having their measuring values extremely different from the design value are rejected. Only remaining mark positions are employed. At this time, the virtual shots themselves which have defective latent image marks may be rejected. Besides, in accordance with this embodiment, there are selected the eight virtual shots formable with the latent images of both of the reticle marks $RM_{x1}$, $RM_{y1}$ from the plurality of virtual shots on the wafer W shown in FIG. 8. However, the virtual shot formable with only any one of the latent images may be selected. Further, in preparation for the rejection described above, at least one virtual shot in close proximity to, e.g., the selected shot is designated as a substitute shot in addition to the eight virtual shots previously selected, and the latent image is formed to make its mark positions substitutable. Besides, if the number of the virtual shots where both of the mark positions of the two latent images are measured is conceived to be 1, it is required in this embodiment that the latent images be detected with respect to at least three virtual shots. Note that only one latent image mark (e.g., in the X-direction) is measured in one virtual shot, and if the other latent image mark (in the Y-direction) is measured in its substitute shot, they may be counted regarding them as one virtual shot.

Next, the EGA calculation unit 62 calculates an array regularity of the latent images on the wafer, viz., transform matrices At, Ot in the following mapping relational formula (5) (determinant Mt=At·Fg+Ot). This calculation is performed based on the measured array coordinate values (Mtx, Mty) of the eight virtual shots which are stored in the alignment data storing unit 61 and the calculative array coordinate values (Fgx, Fgy) stored in the storing unit 63 by g-EGA. Herein, the array regularity of the latent images corresponds to an array regularity of the pattern images when actually effecting the overlay exposure. The transform matrices At, Ot in the above-mentioned relational formula, however, contain each of a residual rotational error $\theta_t$, a perpendicularity $\omega_t$, scaling errors Rtx, Rty and offset errors Otx, Oty as parameters. The transform matrix At has 2 rows and 2 columns, while Ot has two rows and one column.

$$\begin{bmatrix} Mtx \\ Mty \end{bmatrix} = At \begin{bmatrix} Fgx \\ Fgy \end{bmatrix} + Ot \qquad (5)$$

Note that the transform matrices At, Ot are expressed by the following formulae (6) and (7):

$$Ag = \begin{bmatrix} a_t & c_t \\ b_t & d_t \end{bmatrix} \qquad (6)$$

$$= \begin{bmatrix} \cos\theta_t & -\sin\theta_t \\ \sin\theta_t & \sin\theta_t \end{bmatrix} \begin{bmatrix} 1 & -\tan\omega_t \\ 0 & 1 \end{bmatrix} \begin{bmatrix} Rtx & 0 \\ 0 & Rty \end{bmatrix}$$

$$= \begin{bmatrix} Rtx \cdot \cos\theta_t & -Rtx(\cos\theta_t \cdot \tan\omega_t + \sin\theta_t) \\ Rty \cdot \sin\theta_t & Rty(-\sin\theta_t \cdot \tan\omega_t + \cos\theta_t) \end{bmatrix}$$

$$Ot = \begin{bmatrix} e_t \\ f_t \end{bmatrix} = \begin{bmatrix} Otx \\ Oty \end{bmatrix} \qquad (7)$$

Herein, residual terms ($\epsilon Xt$, $\epsilon Yt$) exist with respect to the measuring array coordinate values (Mtx, Mty) and the calculative array coordinate values (Fgx, Fgy) in the shot areas on the wafer. The foregoing formula (5) is rewritten into the following formula (8):

$$\begin{bmatrix} Mtx \\ Mty \end{bmatrix} = At \begin{bmatrix} Fgx \\ Fgy \end{bmatrix} + Ot + \begin{bmatrix} \epsilon Xt \\ \epsilon Yt \end{bmatrix} \qquad (8)$$

Hence, the EGA calculation unit 62 arithmetically determines values of the respective parameters $a_t$–$f_t$ of in the transform matrices At, Ot (by the least squares method) so that the above-mentioned residual terms are minimized. The thus calculated transform matrices At, Ot are stored in the storing unit 63. Note that the array coordinate values of all the virtual shots on the wafer W are not herein necessarily calculated by use of the foregoing formula (5). Further, a series of actions from the step of detecting the latent images to the step of calculating the transform matrices At, Ot (parameters $a_t$–$f_t$) by the least squares method are hereinafter simply referred to as t-EGA.

Now, the EGA calculation unit 62 reads two sets f parameters $a_g$–$f_g$ and $a_t$–$f_t$ which have been calculated respectively by g-EGA and t-EGA and stored in the storing unit 63. There exist herein traces of residual rotational errors $\theta_g$, $\theta_t$ and perpendicularities $\omega_g$, $\omega_t$. The six error parameters in each of g-EGA and t-EGA are expressed by the following formulae (9) and (10):

$$\left.\begin{aligned} \theta_g &= b_g/d_g \\ \omega_g &= -c_g/a_g - b_g/d_g \\ Rgx &= a_g \\ Rgy &= d_g \\ Ogx &= r_g \\ Ogy &= f_g \end{aligned}\right\} \qquad (9)$$

$$\left.\begin{aligned} \theta_t &= b_t/d_t \\ \omega_t &= -c_t/a_t - b_t/d_t \\ Rtx &= a_t \\ Rty &= d_t \\ Otx &= r_t \\ Oty &= f_t \end{aligned}\right\} \qquad (10)$$

Next, the EGA calculation unit 62 obtains differences between the positions of the shot areas on the wafer and the positions of the latent images (i.e., actual exposure positions of the reticle patterns subjected to the overlay exposure); or in other terms, differences between the offset errors (Ogx–Otx), (Ogy–Oty) are obtained by g-EGA and t-EGA. These differences are stored as system offsets in the storing unit 63. Further, the EGA calculation unit 62 calculates a magnification error (variation in size) between the shot areas on the wafer W on the basis of the scaling errors (Rgx, Rgy) or (Rtx, Rty). This information is transferred to the system controller 65. The system controller 65 adjusts a projection magnification of the projection optical system 13 by using the imaging characteristic correction unit 19 to mutually cancel variations in the magnifications of the shot areas due to scaling. The magnification error between the shot area and the projected image of the reticle pattern is substantially zeroed.

The offset measurement before the main exposure is thus ended. The system controller 65 starts the overlay exposure with respect to the wafer W. In this embodiment, the overlay exposure is executed by adopting the EGA method based on the FIA system. The sample alignment, etc., however, has already been conducted by e-EGA. Therefore, the array coordinate values (Fx, Fy) of all the shot areas on the wafer W are herein calculated by use of the following formula (11). However, the transform matrix Ag (parameters $a_g$–$d_g$) in the formula (11), which has been calculated by g-EGA, is used as it is. Hence, the array coordinates (Fx, Fy) calculated from the formula (11) are those into which the array coordinates (Fgx, Fgy) obtained by g-EGA (formula (1)) are corrected by the offset errors (Otx, Oty) acquired by t-EGA.

$$\begin{bmatrix} Fx \\ Fy \end{bmatrix} = Ag \begin{bmatrix} Dx \\ Dy \end{bmatrix} + \begin{bmatrix} Ogx - Otx \\ Ogy - Oty \end{bmatrix} \quad (11)$$

The system controller 65 brings the wafer stage WS into the stepping action in accordance with the calculated results (Fx, Fy) by the EGA calculation unit 62. The overlay exposure of the reticle pattern is effected per shot area. As a consequence of this, the alignment error (sideways shift due to the offset) and the magnification error can be substantially zeroed. It follows that the highly accurate overlay exposure is executed. Note that positioning may be effected with shifts corresponding to the offsets (Otx, Oty) calculated by t-EGA per shot area while stepping the wafer stage WS in accordance with the array coordinate values (Fgx, Fgy) calculated by g-EGA without calculating the array coordinate values (Fx, Fy) from the formula (11).

As discussed above, the system offsets are calculated by applying the EGA method in this embodiment. It is therefore possible to perform the offset measurement at a high speed and a high accuracy. Besides, the latent images of the reticle marks can be formed arbitrary on-wafer positions. There is an advantage of being small in constraint in terms of location when forming the latent images. In particular, when the latent images are formed in the non-exposure domains, an advantage is that it is possible to prevent a decline in the alignment accuracy of next-layer pseudo alignment marks formable on the base in the form of latent images without locating the latent images in the vicinities of the wafer marks. Further, the wafer marks (base marks) and the latent image marks are detectable by separate alignment sensors. That is, the alignment sensors optimal to the detections of the respective marks can be selectively used, and hence, especially the measuring accuracy of the system offset can be improved.

By the way, in accordance with this embodiment, e-EGA is conducted by using the FIA system, while t-EGA is effected by employing the LSA system. According to t-EGA, however, the alignment sensor optimal to the detection of the latent images may be selected corresponding to the types of the base and of the resist and the shapes of the latent image marks. For instance, the LIA system is allowed to be used. Moreover, the same alignment sensor may be employed both in g-EGA and in t-EGA. It is, however, desirable that the main-exposure-oriented alignment sensor be employed in g-EGA. Particularly in this embodiment, the premise is that the EGA system alignment is used during the main exposure. In the main exposure, the transform matrix Ag calculated by e-EGA is used as it is, and only the correction of the system offsets is conducted. For this reason, the positions and the number of sample shots by g-EGA are determined to calculate the array coordinates of the shot areas, viz., the transform matrix Ag at a sufficient accuracy as in the same way with the ordinary main exposure. In other words, it is desirable that g-EGA be conducted absolutely the same as EGA performed by the conventional apparatus in advance of the overlay exposure.

Figure 9A:
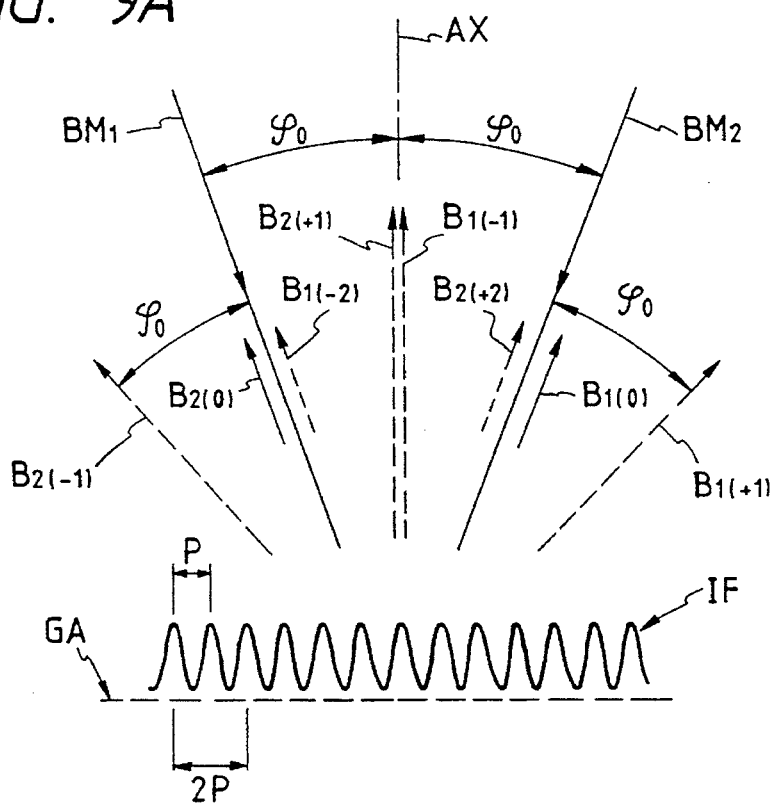
FIGS. 9A and 9B are views of assistance in explaining how an LIA system is employed for detecting latent images.

Herein, the detection of the latent images involving the use of the LIA system will be briefly explained with reference to FIGS. 9A and 9B. Paying attention to FIG. 9A, two beams $BM_1$, $BM_2$ of the LIA system fall on a wafer mark GA at a cross angle $2\phi_0$ from two directions different from each other, the wafer mark GA (pitch is 2P) assuming a shape of diffraction grating. Hereat, interference fringes IF (pitch is P) are formed on the mark GA due to the two beams. By the way, the photoelectric detector 52 in the apparatus described above (FIGS. 1 and 2) receives the interference light caused by a −1st-order diffraction beam $B_1(-1)$ of the beam $BM_1$ and a +1st-order diffraction beam $B_2(+1)$ of the beam $BM_2$ which are generated along the optical axis AX of the projection optical system 13. The photoelectric detector 52 is formed with three light receiving surfaces, i.e., a first light receiving surface for receiving the interference light described above and second and third light receiving surfaces with this first light receiving surface being interposed therebetween. Especially the second and third light receiving surfaces serve to independently detect +1st- through +3rd-order diffraction beams and −1st- through −3rd-order diffraction beams that are generated from the wafer marks due to the irradiation of the spot beams of the LSA system.

Generated further from the wafer marks GA in the same direction are a 0th-order diffraction beam $B_1(0)$ of the beam $BM_1$ and a +2nd-order diffraction beam $B_2(+2)$ of the beam $BM_2$ together with the ±1st-order diffraction beams $B_1(-1)$, $B_2(+1)$. A 2nd-order diffraction beam $B_1(-2)$ of the beam $BM_1$ and a 0th-order diffraction beam $B_2(0)$ of the beam $BM_2$ are generated in the same direction. These two beams of interference light are received by the above-mentioned second and third light receiving surfaces. The photoelectric detector 52 also outputs photoelectric signals obtained by adding these two beams of light. Accordingly, when measuring the wafer marks (base marks), the LIA calculation unit 58 determines a mark position on the basis of a phase-difference in waveform between at least one of the two photoelectric signals coming from the photoelectric detector 52 and the photoelectric signal (reference signal) SR coming from the photoelectric detector 56.

Now, in the case of using the LIA system having the configuration stated above, the ±1st-order diffraction beams may be photoelectrically detected with the aid of a latent image mark having the same pitch as that of the wafer mark GA. In terms of contrast, however, it is more advantageous to receive the 0th-order diffraction beam. For this reason, a latent image mark GB having the pitch P shown in FIG. 9B is to be employed in the LIA system. Received in the positional measurement is the interference light caused by the 0th-order diffraction beam $B_1(0)$ of the beam $BM_1$ and the +1st-order diffraction beam of the beam $BM_2$ that are generated in the same direction among beams of interference light generated from the relevant marks. There is also received the interference light caused by the −1st-order diffraction beam $B_1(-1)$ of the beam $BM_1$ and the 0th-order diffraction beam $B_2(0)$ of the beam $BM_2$. Herein, it follows that these two beams of interference light are incident on the second and third light receiving surfaces of the photoelectric detector 52. Namely, the pitch of the latent image mark is set to one-half of the pitch of the wafer mark, thereby making it possible to improve the measuring accuracy of the latent image mark without modifying the geometry of the LIA system. Accordingly, when measuring the latent image mark, the LIA calculation unit 58 determines the mark position from the phase-difference between the photoelectric signals coming from the second and third light receiving surfaces of the photoelectric detector 52 and the reference signal SR.

Further, the latent images are to be formed with respect to the eight virtual shots (FIG. 8) according to t-EGA in the embodiment discussed above. The number and the positions thereof may be determined in accordance with the calculation accuracy of the transform matrices AT, Ot. Moreover, if the non-exposure domain is narrow (area is small), and when the number of the virtual shots can probably be decreased, at least one of the plurality of shot areas on the wafer W is selected as a virtual shot. This virtual shot may be employed as a waste shot (a part of the non-exposure domain) for the measurement. In the case of using the waste shot, it is desirable that the pattern exposure is not executed with respect to the relevant shot in the exposure step up to the previous layer. Further, the shot area designated as a waste shot is desirably located on the outermost periphery of the wafer W. It is because a defect occurrence rate in the shot area on the outermost periphery is relatively high.

Further, t-EGA is executed only once in the embodiment discussed above but may be effected twice or more. In this case, a mean value of the respective measured values may be used as an offset error. At this time, the positions and the number of the virtual shots for detecting the latent images are allowed to be made different for every execution of t-EGA. Note that t-EGA does not require a calculation of even the transform matrix At, but only the transform matrix Ot, i.e., the offset errors (Otx, Oty) may be calculated. Further, there is certainly no necessity for equalizing the number n of the shot areas employed for t-EGA to the number m of the sample shots used for g-EGA. The positions and the number thereof may be set to values corresponding to the calculation accuracies required respectively.

Additionally, the system offsets (Ogx–Otx), (Ogy–Oty) are measured by use of the first in-lot wafer in the embodiment discussed above. The offset measurement is not particularly required to be conducted in wafers after the second one. The previously measured values may be used as they are to perform the alignment. However, if types of the base and the resist and the types (shape and step, etc) of the wafer marks are different even in the wafer within the same lot, or if the alignment sensor is modified, it is desirable that the system offsets be measured definitely by the same actions as those mentioned above by using the first wafer after this modification. Further, even if the conditions are not modified as described above, the system offset is measured for each of the unit number of wafers, per lot or per unit time, and the data stored in the storing unit 63 may be sequentially updated. Moreover, if the system offset is extremely large, it is desirable to re-execute the reticle alignment and the baseline measurement or the measurement of the imaging characteristics (magnification, distortion, etc.) of the projection optical system 13. Alternatively, there may be modified the signal processing conditions (algorithms) of the alignment sensor used for g-EGA (i.e., main exposure), the alignment sensor itself, the number and the positions of the sample shots by g-EGA, or the alignment sensor used by t-EGA and its signal processing conditions and the conditions (pitch, shape, etc.) for forming the latent image marks. Contrastingly, if the system offset is well smaller than the alignment accuracy, the array coordinates calculated by g-EGA are allowed to be directly employed in the main exposure.

Further, the EGA system alignment is performed even in the main exposure in accordance with this embodiment, however, even when effecting a die-by-die alignment (DDA) by use of, e.g., a TTR (Through The Reticle) system alignment sensor, the system offset is calculated certainly by the same actions as those in the embodiment discussed above with the aid of this alignment sensor. On the occasion of executing DDA, the system offset is employed per shot area. That is, the shot area may be positioned with a shift corresponding to an offset with respect to the projection image of the reticle pattern. An improvement in the alignment accuracy can be expected. This arrangement is effective especially in the alignment sensor involving the use of the non-exposure light as disclosed in, e.g., U.S. Ser. No. 687,944 (Apr. 19, 1991) filed by the present applicant.

Further, in the embodiment discussed above, there are used the scaling error and the offset error among the parameters calculated by g-EGA and t-EGA. However, other errors, videlicet, the residual rotational error and the perpendicularity are not employed. At least one of the perpendicularities $\omega_g$, $\omega_t$ may, however, be used for correcting the array coordinate values (Fx, Fy) per shot area. This is done by changing the transform matrix AG in the formula (11), i.e., the values of the parameters $a_g$–$d_g$ according to the perpendicularities. On the other hand, the array coordinate values (Fx, Fy) per shot area may be corrected by changing the values of the parameters $a_g$–$d_g$ in accordance with a difference between the residual rotational errors $\theta_g$, $\theta_t$. This arrangement is useful for a case where the stepper which exposes the circuit pattern (base pattern) on the wafer W is different from the stepper for performing the overlay exposure of the reticle pattern on the next layer on this circuit pattern, and, besides, traveling characteristics (peculiarities) of the wafer stage are different from each other.

Based on a predetermined program per parameter, the EGA calculation unit 62 herein determines whether or not any one or two sets of six parameters of g-EGA and six parameters of t-EGA are selected as parameters (formula (11)) employed in the main exposure. Alternatively, the operator designates it through an input device. In this embodiment, it is enough to simply employ at least two sets of offset errors (Ogx, Ogy), (Otx, Oty).

Figure 10:
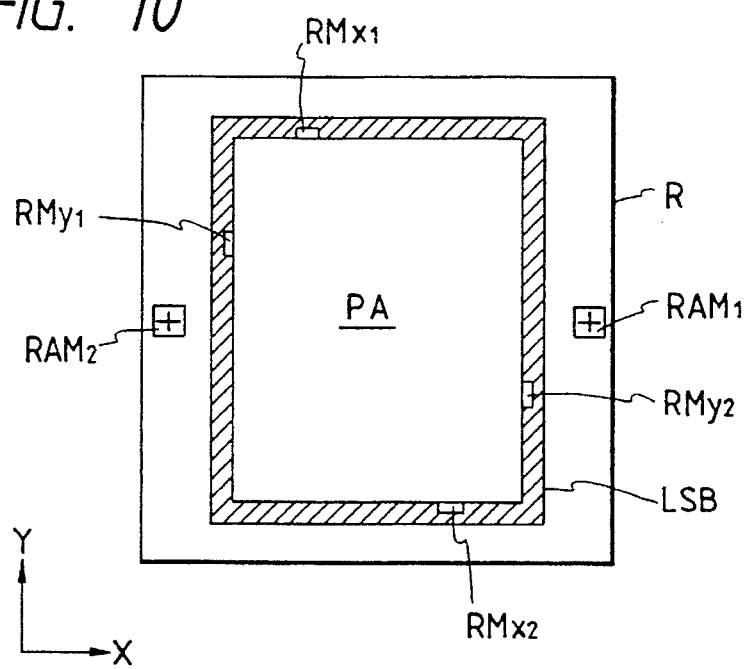
FIG. 10 is a view showing a variant form of the reticle used in the first embodiment.

Furthermore, when effecting the overlay exposure of the reticle R (FIG. 4A) in the embodiment given above, it follows that particularly the reticle marks $RM_{x1}$, $RM_{y1}$ among the four reticle marks are exposed in superposition on the wafer marks MX, MY per shot area. Besides, the reticle marks $RM_{x2}$, $RM_{y2}$ can be also exposed in superposition on the wafer marks in the shot area adjacent to the shot area to be exposed. Then, the reticle mark forming positions on the reticle R may be, as illustrated in FIG. 10, preferably shifted beforehand so that the four reticle marks are not overlaid on the wafer marks. The areas corresponding to the wafer marks on the reticle thereby turn out light-shielding portions. Especially when using a positive type resist, there is eliminated a possibility in which the resist layer on the wafer mark is not photosensitized with the overlay exposure. This results in a reduction in rupture of the marks due to an etching process or the like. Note that the alignment mark for, e.g., the TTR system alignment sensor can be formed on the reticle R separately from the reticle marks by adopting the above-mentioned arrangement. Further, the four reticle marks shown in FIGS. 4A and 10 are preferably disposed in symmetry with respect to the reticle center. Considering particularly an Abbe error, as depicted in FIG. 4A, the four reticle marks are formed desirably in symmetry with respect to the reticle center and at the centers of the respective sides.

Moreover, the two reticle marks $RM_{x1}$, $RM_{y1}$ are employed in the embodiment discussed above, and the latent images thereof are formed in the non-exposure domains. Herein, if the non-exposure domain is small, and when the number of virtual shots is reduced, as stated earlier, the shot area located on the outermost periphery of the wafer W is designated as a virtual shot. This virtual shot is set as a waste shot for the measurement. The number of the virtual shots can be apparently increased. At this time, if the reticle R shown in FIG. 10 is used, the designated shot area do not have to be the waste shot, thereby preventing a drop in yield. A brief explanation will hereinafter be given with reference to FIG. 11.

Figure 11:
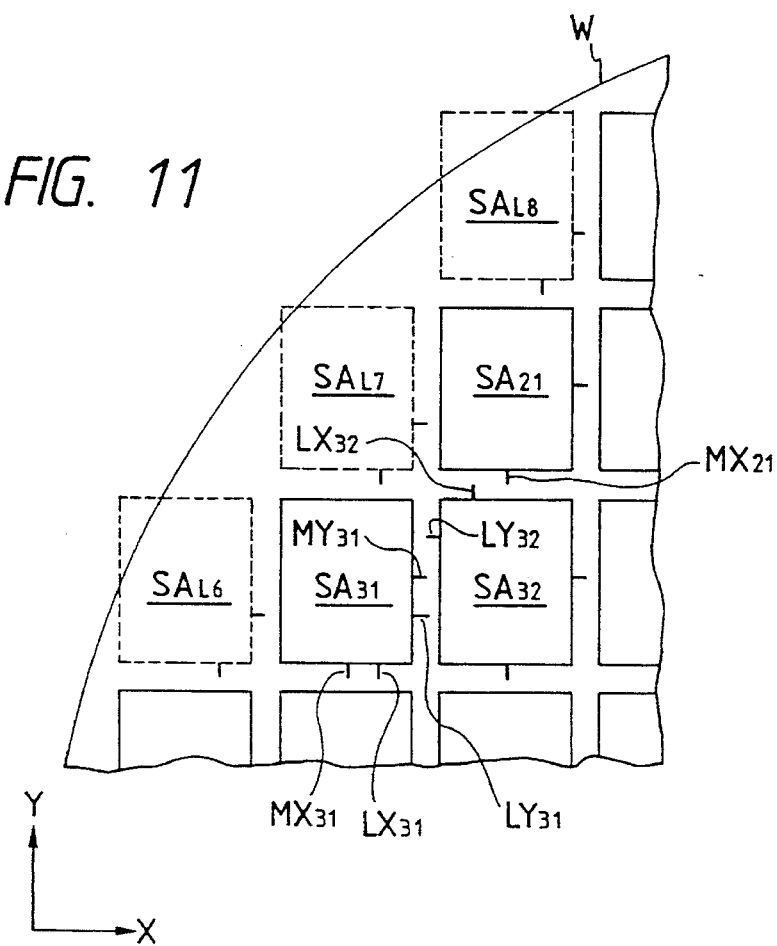
FIGS. 11 through 13 are partially enlarged views of the wafer shown in FIG. 8.

FIG. 11 is a partially enlarged view of the wafer shown in FIG. 8. Turning to FIG. 11, if a shot area $SA_{31}$ is designated as a measurement shot, the shot area $SA_{31}$ is positioned in an exposure position in accordance with the array coordinate values (Fgx, Fgy) calculated by g-EGA. Thereafter, only the reticle marks $RM_{x1}$, $RM_{y1}$ of the reticle R shown in FIG. 10 are irradiated with the exposure light. Their latent image marks $LX_{31}$, $LY_{31}$ are thereby formed on the wafer W. As obvious from FIG. 11, the latent image marks $LX_{31}$, $LY_{31}$ are not formed while being overlaid on wafer marks $MX_{31}$, $MY_{31}$. These latent image marks are usable in t-EGA. Besides, it can be known that the shot area $SA_{31}$ does not have to be the waste shot.

Herein, the forming positions of the reticle marks $RM_{x1}$, $RM_{y1}$ on the reticle R are shifted well apart from the central portions (areas corresponding the wafer marks) of the respective sides. In this case, it follows that the latent image marks $LX_{31}$, $LY_{31}$ and the wafer marks $MX_{31}$, $MY_{31}$ are also formed sufficiently apart from each other on the wafer W. Accordingly, the latent image marks and the wafer marks can be detected independently and separately from each other by means of the alignment sensor. Besides, the pseudo marks relative to the latent images are by no means formed in the vicinities of the wafer marks on the next layer. Further, latent images of the reticle marks $RM_{x2}$, $RM_{y2}$ are formed in the shot area $SA_{32}$. In this instance, there is no possibility in which latent image marks $LX_{32}$, $LY_{32}$ are not superposed on a wafer mark $MX_{21}$ of a shot area $SA_{21}$ and a wafer mark $MY_{31}$ of a shot area $SA_{31}$, these shot areas $SA_{21}$, $SA_{31}$ being adjacent to the shot area $SA_{32}$.

Further, as apparent from the above-mentioned, all the virtual shots are also selectable from the plurality of shot areas on the wafer W without setting any virtual shot used for t-EGA in the non-exposure domains. At this time, the number and the positions of the shot areas designated as the virtual shots may be determined irrespective of the number and the positions of the sample shots designated by g-EGA. This arrangement is effective especially in a case where the non-exposure domain on the wafer is small depending on a pattern size, and a large number of virtual shots can not be set therein.

Moreover, in the explanation given above, the virtual shots in one non-exposure domain are set apart by a shot size thereof so that the shots are not overlapped with each other. Therefore, when the non-exposure domain is small, as explained above, all or a part of the virtual shots are selected for use from the plurality of shot areas. However, even when some virtual shots are overlapped within the non-exposure domain, and if the latent image marks corresponding thereto are not overlapped or not formed closely, these latent image marks can be used for t-EGA. This leads to a reduction in the number of virtual shots. Namely, it is possible to prevent a decline in terms of the calculation accuracy of the transform matrices AT, Ot by t-EGA.

Figure 12:
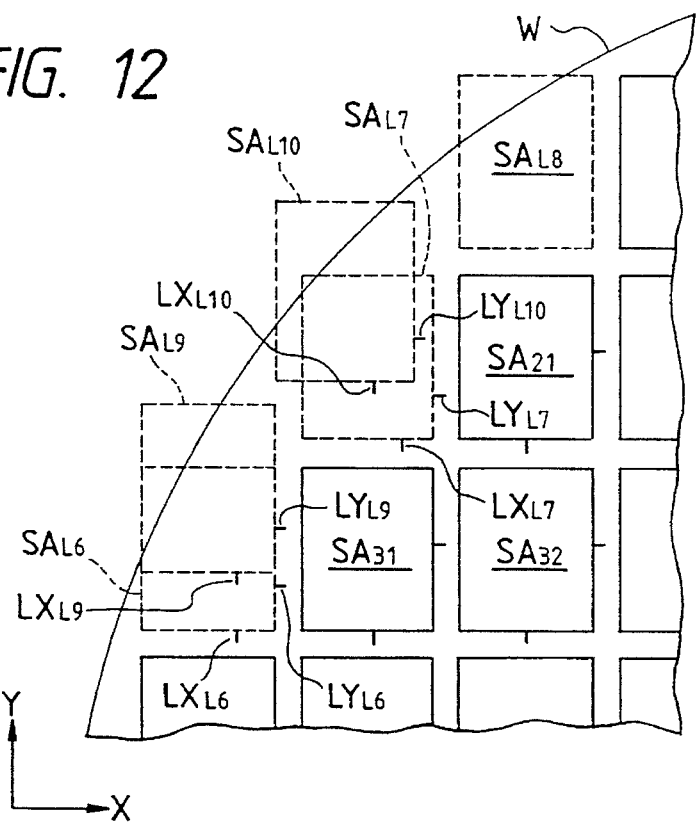

Then, if the non-exposure domain on the wafer is small, or when increasing the number of virtual shots, as shown in FIG. 12, the following step may be taken. The plurality of virtual shots are set within the same non-exposure domain in such a manner that, even when some virtual shots are overlapped as illustrated in FIG. 12, the latent image marks thereof are not all or partially overlapped or not formed inclose proximity to each other. Paying attention to FIG. 12, a virtual shot $SA_{L6}$ is set apart a predetermined distance (a value smaller than the shot size) in the Y-direction from a virtual shot $SA_{L9}$. For this reason, latent image marks $LX_{L6}$, $LY_{L6}$ of the virtual shot $SA_{L6}$ are spaced sufficiently from latent image marks $LX_{L9}$, $LY_{L9}$ of the virtual shot $SA_{L9}$. Any mark is usable for t-EGA. Similarly, a virtual shot $SA_{L10}$ is shifted by predetermined quantities in the X- and Y-directions with respect to a virtual shot $SA_{L8}$. Latent image marks $LX_{L10}$, $LY_{L10}$ and latent image marks $LX_{L8}$, $LY_{L8}$ are not formed in close proximity to each other.

Further, only the two reticle marks $RM_{x1}$, $RM_{y1}$ of the reticle R FIGS. 4A and 10) are formed as the latent image marks in the embodiment described above. However, three or four reticle marks may be employed. In this instance, three or four latent image marks are measured per virtual shot by t-EGA. It is thus possible to obtain a residual rotational error $\theta_R$ of the reticle R with respect to the rectangular coordinate system XY from positions of the latent image marks of the two reticle marks $RM_{x1}$, $RM_{x2}$ or $RM_{y1}$, $RM_{y2}$ disposed in a face-to-face relationship on the reticle R. The residual rotational error $\theta_R$ may be corrected by a micromotion of the reticle stage RS. However, when calculating the array coordinate values (Fx, Fy) of the shot area according to the previous formula (11), the correction is made to use a target value of a residual rotational error $\theta_g$, or $\theta_t$ of the wafer W (the array coordinate system of the shot area) with respect to the rectangular coordinate system XY. That is, the array coordinate values (Fx, Fy) of the shot area may be calculated, wherein $(\theta_g + \theta_R)$ is the residual rotational error of the wafer in the formula (11). Note that the residual rotational error $\theta_R$ takes desirably an average of the values measured respectively in the plurality of virtual shots. Further, when three or more reticle marks are formed as latent images per virtual shot, the latent image marks are probably overlaid on the Wafer marks in the shot area, and hence the reticle R shown in FIG. 10 is employed. Alternatively, it is desirable that the position of the virtual shot be shifted by a predetermined quantity in at least one of the X- and Y-directions towards the outer periphery.

Herein, the virtual shots are set in the non-exposure domains on the wafer in this embodiment. It is therefore impossible to form only one or two latent image marks in one virtual shot in some cases. In this instance, preferably, all or a part of the virtual shots are selected from the plurality of shot areas on the wafer W (FIG. 11). At this time, only the virtual shots used for calculating the residual rotational error $\theta_R$ may also be selected from the plurality of shots.

Figure 13:
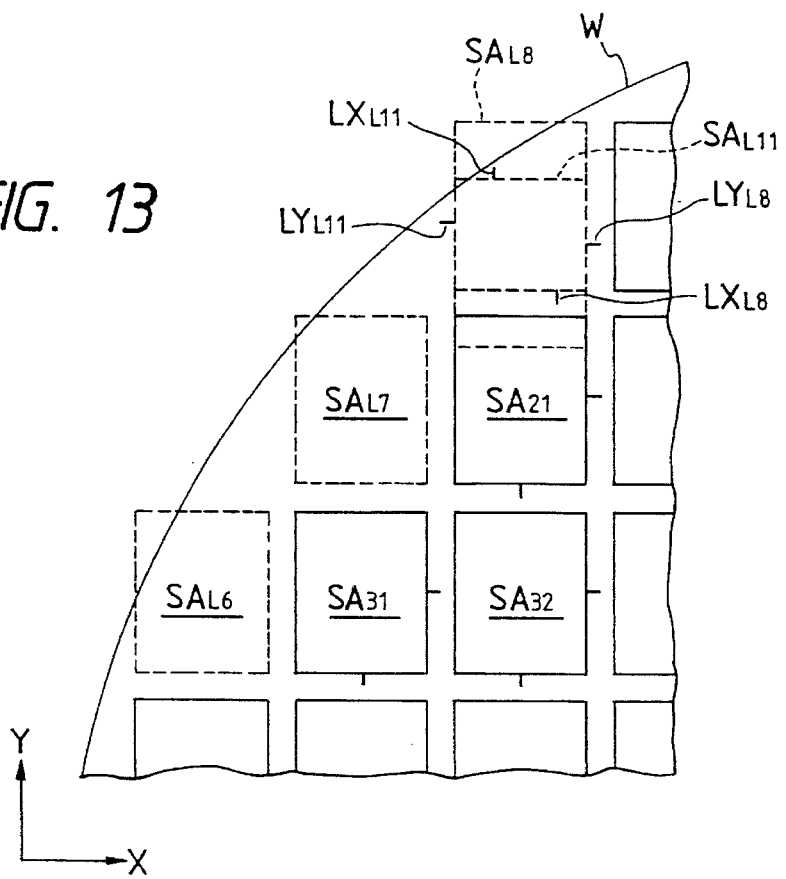

Alternatively, as shown in FIG. 13, the latent images (marks $LX_{L8}$, $LY_{L8}$) of the two reticle marks $RM_{x1}$, $RM_{y1}$ are formed in the virtual shot $SA_{L8}$. Thereafter, the wafer stage WS is stepped by a predetermined quantity in at least one of the X- and Y-directions (only in the Y-direction in the Figure) so that at least one of the two remaining reticle marks $RM_{x2}$, $RM_{y2}$ is formed as a latent image on the wafer W. At least one of the reticle marks $RM_{x2}$, $RM_{y2}$ is formed as a latent image (marks $LX_{L11}$, $LY_{L11}$). In other words, there is set the virtual shot $SA_{L11}$ spaced a predetermined distance in at least one of the X- and Y-directions with respect to the virtual shot $SA_{L8}$. At least one of the reticle marks $RM_{x2}$, $RM_{y2}$ is formed as the latent image (marks $LX_{L11}$, $LY_{L11}$) in the virtual shot $SA_{L11}$. As a result, even in the virtual shot where three or more reticle marks can not be formed as latent images at one time, the residual rotational error $\theta_R$ of the reticle R can be calculated by applying the shift exposure described above.

Note that the latent image marks $LX_{L11}$, $LY_{L11}$ approach the latent image marks $LX_{L8}$, $LY_{L8}$ (its interval becomes smaller than the shot size) on the wafer W in the above-stated shift exposure, and consequently, the measuring accuracy of the residual rotational error $\theta_R$ of the reticle R probably declines. Herein, if any one of the latent image marks $LX_{L11}$, $LY_{L11}$ is formed on the wafer, the residual rotational error $\theta_R$ of the reticle R can be calculated. It is therefore desirable to determine a stepping quantity of the wafer stage WS so that the interval is not shortened to the greatest possible degree. Whereas if there is a space in the non-exposure domain, the measuring accuracy can be enhanced by expanding the interval over the shot size. In any shift exposure, however, the wafer stage is stepped, and hence its stepping error induces an error in the measured value (mark position). This in turn conduces to a decrease in the measuring accuracy. Then, the shift exposure is repeatedly conducted a plurality of times while making the intra non-exposure domain latent image forming domains different from each other. It is desirable that the residual rotational error of the reticle R be determined based on the plurality of measured values by, e.g., an averaging process.

Figure 14A:
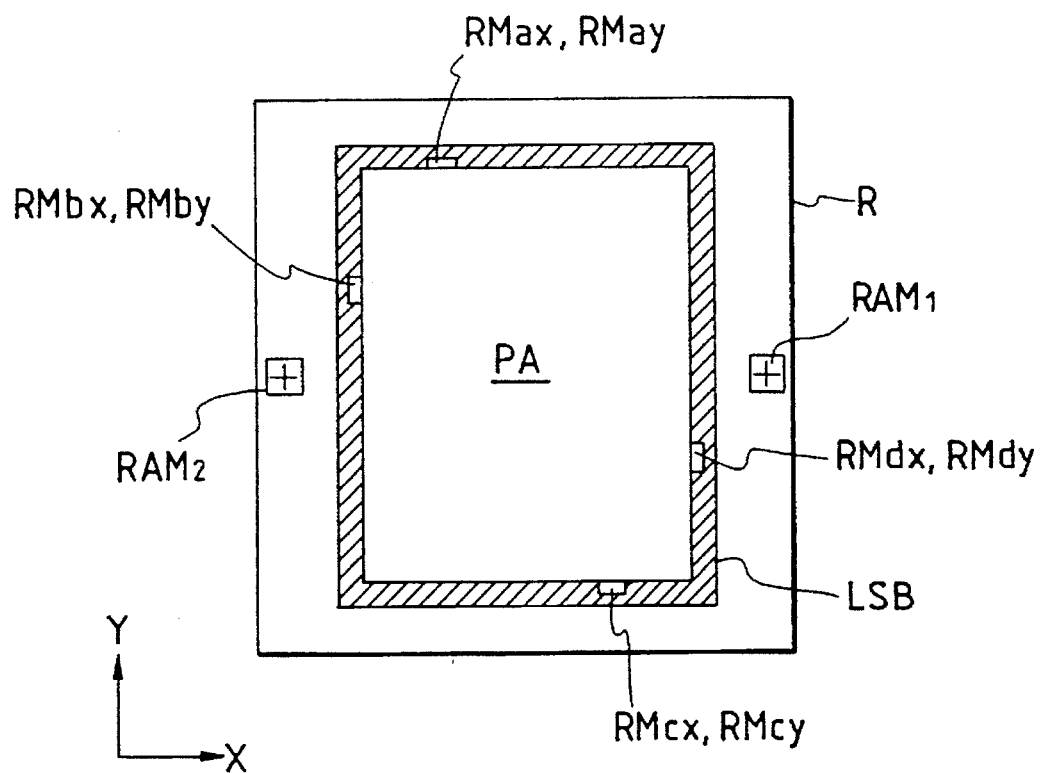
FIG. 14A is a view illustrating a geometry of a reticle employed in a second embodiment.
Figure 14B:
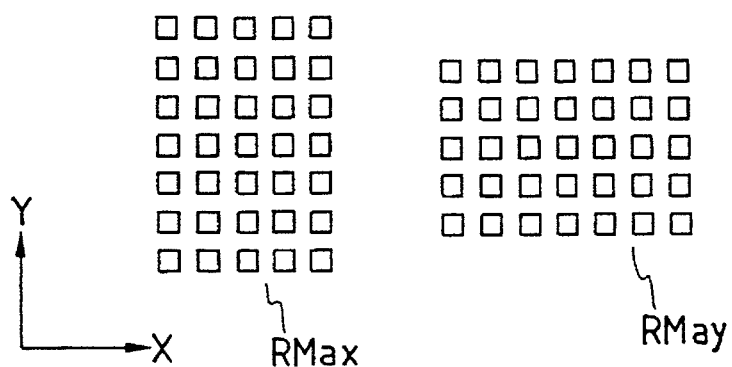
FIG. 14B is a view showing a specific layout of reticle marks illustrated in FIG. 14A.

Next, the positioning method in a second embodiment of the present invention will be explained. The projection magnification of the projection optical system 13 is measured by utilizing the latent images in the second embodiment. This is a difference from the first embodiment, and, herein, the discussion is centered on this difference. FIG. 14A schematically illustrates a configuration of the reticle R used in this embodiment. A difference from FIG. 10 is that two reticle marks are formed in each of four transparent windows in the light shielding band LSB. FIG. 14B shows one example of the two reticle marks RMax, RMay formed in the transparent window. The two reticle marks are, it is assumed, formed by making the arranging directions of the reticle marks $RM_{x1}$ orthogonal to each other. Note that if it is unnecessary to distinguish the two reticle marks MRmx, RMay, they are simply termed a reticle mark RMa.

Figure 15:
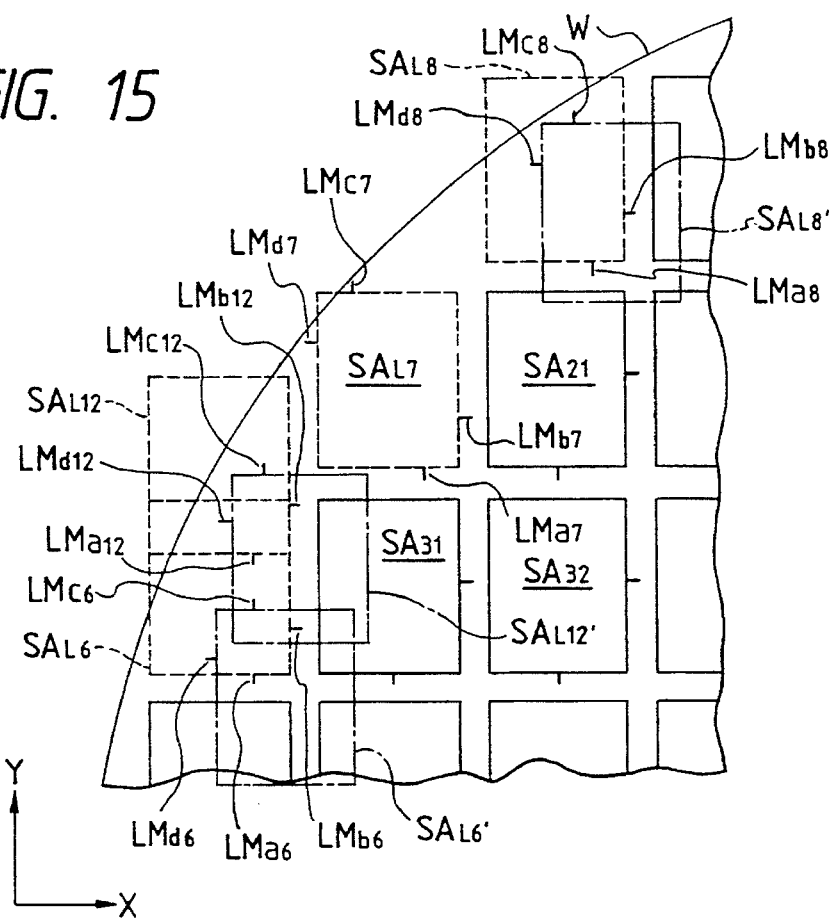
FIG. 15 is a partially enlarged view of the wafer shown in FIG. 8.

Now, to begin with, the system controller 65 performs, as absolutely in the same way with the first embodiment, the steps starting from loading of the reticle R (FIG. 14A) to g-EGA. Calculated by g-EGA in this embodiment are the transform matrices Ag, Og and the array coordinate values (Fgx, Fgy) of the virtual shots $SA_{L1}$–$SA_{L8}$ in FIG. 8 and a virtual shot $SA_{L12}$ in FIG. 15. FIG. 15 is a partially enlarged view of the wafer W shown in FIG. 8.

The system controller 65 also propels the reticle blind 6 so that only two reticle marks RMa, RMb are irradiated with the exposure light IL. Thereafter, the wafer stage WS is stepped in accordance with the previous array coordinate values, whereby latent images of the reticle marks RMa, RMb are formed per virtual shot. At this moment, as illustrated in FIG. 15, four reticle marks RMa–RMd are all irradiated with the exposure light IL the virtual shot $SA_{L7}$, thereby forming latent images ($LM_{a7}$–$LM_{d7}$) thereof. Further, the two reticle marks RMa, RMb are formed as latent images in each of the three virtual shots $SA_{L6}$, $SA_{L8}$, $SA_{L12}$. After this step, the reticle blind 6 is propelled so that only the reticle marks RMc, RMd are irradiated with the exposure light. The same shift exposure as the exposure explained in FIG. 12 is conducted. Videlicet, the wafer stage WS is stepped by predetermined quantities in the X- and Y-directions, thereby forming the latent images thereof.

Figure 16:
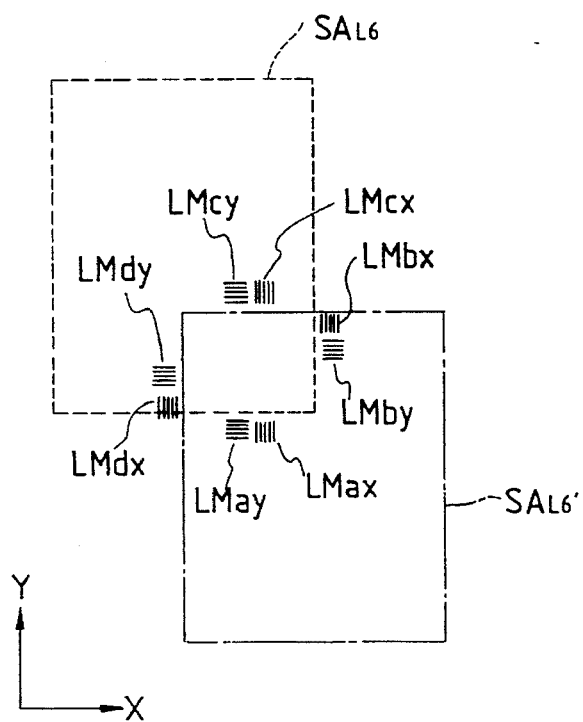
FIG. 16 is a view showing one virtual shot illustrated in FIG. 15;.

Formed in, e.g., the virtual shot $SA_{L6}$, as shown in FIG. 16, are latent image marks LMax, LMay (corresponding to the latent image $LM_{a6}$ in FIG. 15) and latent images LMbx, LMby (corresponding to the latent image $LM_{b6}$ in FIG. 15) of two sets of reticle marks RMax, RMay and RMbx, RMby. Thereafter, the reticle blind 6 is propelled so that only the reticle marks RMc, RMd are irradiated with the illumination light IL. Next, the wafer stage WS is stepped to set a virtual shot $SA_{L6}'$. Formed thereafter are latent image marks LMcx, LMcy (corresponding to the latent image $LM_{c6}$ in FIG. 15) and latent image marks LMdx, LMdy (corresponding to the latent image $LM_{d6}$ in FIG. 15) of two sets of reticle marks RMcx, RMcy and RMdx, RMdy. Note that the latent images are formed by the same actions in each of the virtual shots $SA_{L8}$, $SA_{L12}$.

Next, the system controller 65 brings the wafer stage WS into the stepping action in accordance with the array coordinate values (Fgx, Fgy) given above. The positions of all the latent image marks formed on the wafer W are measured by use of the two LSA systems. The EGA calculation unit 62 calculates the projection magnification M of the projection optical system 13 and the residual rotational error $\theta_R$ of the reticle R on the basis of positional information in each of the four virtual shots $SA_{L6}$–$SA_{L8}$, $SA_{L12}$. For instance, in the virtual shot $SA_{L6}$ (FIG. 16), the projection magnification is obtained from the Y-directional positions of the latent image marks LMay, LMcy or LMby, LMdy. The residual rotational error is obtained from the X-directional positions of the latent image marks LMax, LMcx or LMbx, LMdx. The projection magnification and the residual rotational errors are calculated similarly in the three remaining virtual shots. Herein, a calculation error is produced in the projection magnification M due to the residual rotational error $\theta_R$. Therefore, the projection magnification M is corrected corresponding to the residual rotational error $\theta_R$. The projection magnification M and the residual rotational error $\theta R$ are determined based on the plurality of calculated values given above by, e.g., the averaging process. This step is effective in terms of averaging the stepping errors during the formation of the latent images. Thereafter, as definitely in the same way with the first embodiment, t-EGA is conducted by using the positions of the latent image marks per virtual shot, and the transform matrices At, Ot are calculated.

Furthermore, the EGA calculation unit 62 determines system offsets (Ogx–Otx), (Ogy–Oty) by g- and t-EGAs with the aid of the calculated result. The EGA calculation unit 62 calculates the array coordinate values (Fx, Fy) of all the shot areas on the wafer W in accordance with the forgoing formula (11). Based on the scaling errors (Rgx, Rgy) or (Rtx, Rty), the EGA calculation unit 62 also calculates a magnification error (variation in size) of the shot area on the wafer. This information and the projection magnification M are transferred to the system controller 65. The system controller 65 adjusts the projection magnification of the projection optical system 13 in cooperation with the imaging characteristic correction unit 19 so that a magnification error between the projected image, the reticle pattern and the shot area is zeroed.

By the way, in connection with the residual rotational error $\theta_R$ of the reticle R, the array coordinate values (Fx, Fy) per shot area are corrected by causing relative rotations (particularly rotations of the wafer W) between the reticle R and the wafer W or by changing the values of the parameters $a_g$–$d_g$ in the formula (11) according to a difference between the residual rotational errors $\theta_g$, $\theta_r$. A drop in the alignment accuracy that is derived from the residual rotational error $\theta_R$ is thereby prevented. Further, the array coordinate values (Fx, Fy) per shot are corrected by changing the values of the parameters $a_g$–$d_g$ in the formula (11) by using at least one of the perpendicularities $\omega_g$, $\omega_r$.

Thereafter, the system controller 65 puts the wafer stage WS into the stepping action in accordance with the calculated result given by the EGA calculation unit 62. The overlay exposure of the reticle patterns are thus performed per shot area. In consequence of this, it is possible to prevent the decrease in the alignment accuracy due to the system offset, the residual rotational error of the reticle R and the magnification error (more specifically, the magnification error between the projected image of the reticle pattern and the shot area) of the projection optical system 13. The overlay exposure can be performed at a high accuracy.

As discussed above, in this embodiment, it is possible to calculate the residual rotational error of the reticle R and even the projection magnification of the projection optical system together with the system offset by applying the EGA system. The high-speed and high-accuracy overlay exposure can be conducted. Incidentally, the residual rotational error $\theta_R$ and the projection magnification M are calculated by using the positions of the latent images in each of the four virtual shots $SA_{L6}$–$SA_{L8}$, $SA_{L12}$ (FIG. 15) in accordance with this embodiment. As a matter of fact, however, there may be merely employed the measured values in one virtual shot (e.g., the virtual shot $SA_{L7}$) formable with the latent images of at least three reticle marks among the four reticle marks RMa–RMd. The non-exposure domain is, however, small. Accordingly, when the above-mentioned shift exposure is not adopted, and if the latent images of at least three reticle marks can not be formed, it is desirable to use the measured values in the plurality of virtual shots to eliminate an influence of the stepping error. Further, in accordance with this embodiment, only the two reticle marks are irradiated with the exposure light, thereby forming their latent images. Excepting the virtual shots in which the above-stated shift exposure is effected, all the four reticle marks may be irradiated with the exposure light to form the latent images-thereof.

Now, in accordance with this embodiment, the latent images are formed after performing g-EGA. The system offset, the residual rotational error and the projection magnification are calculated by t-EGA. The residual rotational error may be, however, calculated and corrected in advance of g-EGA. Selected, for example, is at least one virtual shot formable with the latent images of at least three reticle marks among the four reticle marks RMa–RMd. The latent images are formed in this selected virtual shot. The virtual shot to be selected herein may be selected from those in the non-exposure domains or from the plurality of shot areas on the wafer W. Thereafter, the residual rotational error (and further the projection magnification) is calculated from the positions of the latent image marks formed beforehand. Particularly the residual rotational error is corrected by, e.g., rotating the wafer W so that a relative rotational error between the reticle R and the wafer W is zeroed. After finishing the actions described above, the system offsets are obtained as definitely in the same way with the first embodiment. For this purpose, g-EGA, the formation of the latent images and t-EGA are executed; and the array coordinate values (Fx, Fy) of the shot areas on the wafer W may be determined.

Next, the positioning method in a third embodiment will be explained. The third embodiment is characterized by using an alignment system U.S. Ser. No. 005,146 (Jan. 15, 1993) filed previously by the present applicant and hereinafter called P-EGA system) which is an improved version of the EGA system adopted in the first and second embodiments. The following is an explanation of the P-EGA system. The data (coordinate positions) are weighted per sample shot in accordance with distances between the shot area to be positioned in a predetermined fiducial position and each of a plurality of sample shots. The transform matrices are determined by effecting a statistic calculation (the least squares method) with the help of the thus weighted data. Thereafter, the array coordinate values of the shot areas are calculated under these transform matrices. Then, before the discussion on the positioning method in this embodiment, the P-EGA system will be briefly explained referring to FIG. 17.

Figure 17:
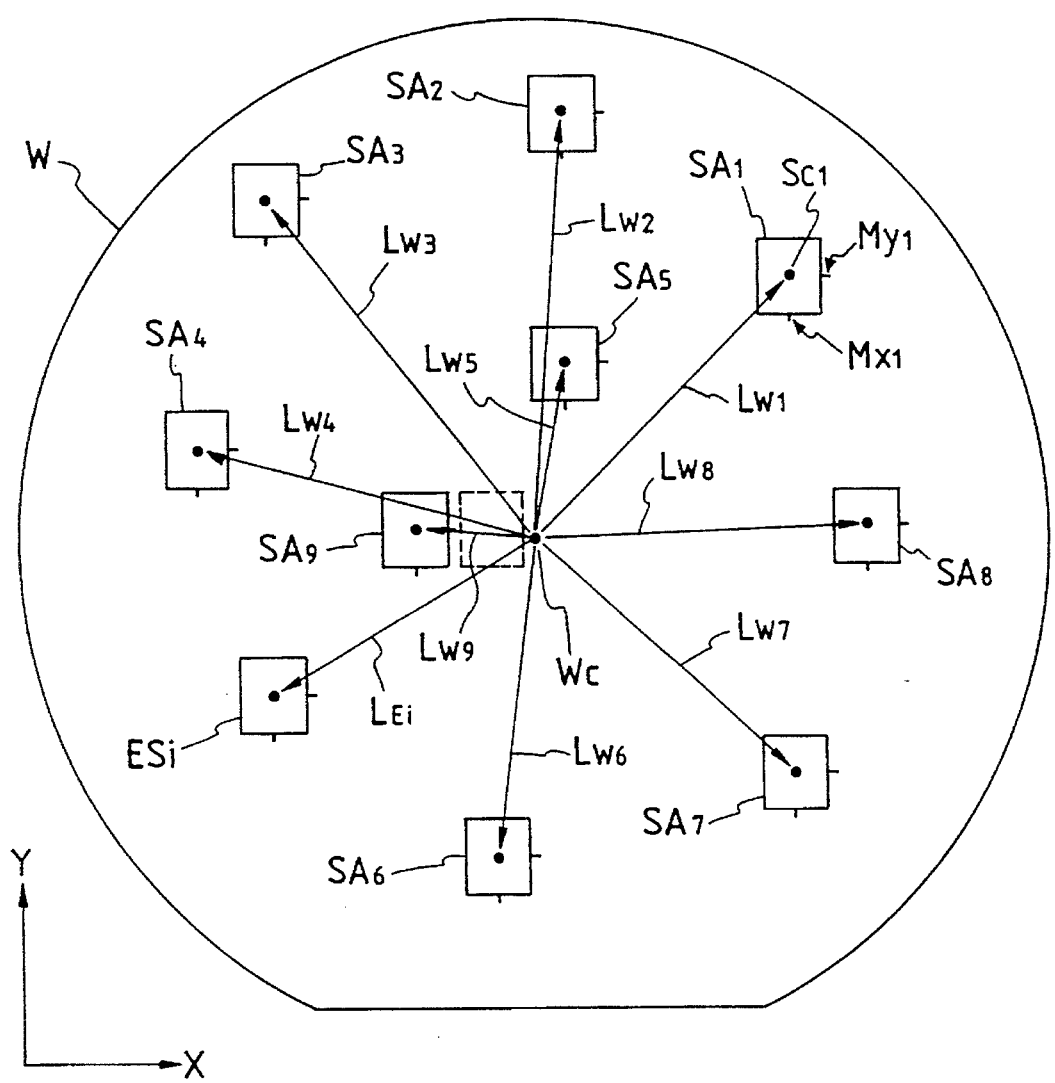
FIG. 17 is a view of assistance in explaining the principle of the positioning method in a third embodiment.

As depicted in FIG. 17, according to the P-EGA system, a weight $W_{is}$ is given to each of coordinate positions of nine sample shots. This weighting action is effected in accordance with distances $L_{k1}$–$L_{k9}$ between the i-th shot area ESi on the wafer W which is to be positioned and each of m-pieces (nine in the Figure) of sample shots $SA_1$–$SA_9$. Further, a residual squares-sum Ei is evaluated by the following formula in the same manner as the conventional EGA system. Transform matrices A, O (parameters a–f) are determined to minimize Ei in the following formula. Note that the number and the positions of the sample shots used per shot area are the same in the P-EGA system. The weight imparted to the alignment data (coordinate positions) is, however, varied per shot area. Hence, it follows that the parameters a–f are determined per shot area, and the coordinate positions thereof are calculated in the P-EGA system.

$$Ei = \sum_{s=1}^{m} W_{is}(\epsilon X_s)^2 + (\epsilon Y_s)^2 \tag{12}$$

Herein, the weight $W_{is}$ with respect to each sample shot per shot area is varied. For this purpose, according to the P-EGA system, the wight $W_{is}$ is, as shown in the following formula, expressed as a function of a distance $L_{ks}$ between the i-th shot area ESi to be positioned and the s-th sample shot $SA_s$.

$$W_{is} = \frac{1}{\sqrt{2\pi U}} e^{-L k s^2 / 2U} \tag{13}$$

where U is the parameter for changing a degree of weighting.

Note that the weight $W_{is}$ given to the alignment data (coordinate positions) becomes, as apparent from the formula (13), large as the sample shot has the shorter distance $L_{ks}$ from the shot area ESi to be positioned.

Herein, if a value of the parameter U is infinite in the formula (13), the result of the statistic calculating process is equalized to a result obtained by the conventional EGA system. On the other hand, if all the shot areas to be exposed are set as sample shots, and when the value of the parameter U is set to 0, the result is equal to a result obtained by the D/D system. Namely, in accordance with this embodiment, the parameter U is set to a proper value, thereby making it possible to obtain an intermediate result between the EGA and D/D systems. Substantially the same effect (alignment accuracy) as that in the D/D system can be obtained by setting the parameter U to a small value with respect to especially the wafer having a large non-linear component. The alignment error attributed to the non-linear component can be well eliminated. Further, if a measurement reproducibility of the alignment sensor is poor, much the same effect as that in the EGA system is obtainable by setting the parameter U to a large value. The alignment error can be reduced owing to an averaging effect. More specifically, the effects from the EGA system to the D/D system can be varied by properly changing the value of the parameter U. The alignment is flexibly varied corresponding to, e.g., a magnitude of the non-linear component and a quality of the measurement reproducibility of the alignment sensor with respect to a variety of layers. The alignment can be conducted with respect to each layer under the optimum conditions.

Next, the positioning method in this embodiment will be discussed. Only a difference from the first embodiment will be herein stated. Now, the system controller 65 at first, as definitely in the same way with the first embodiment, executes the steps from loading of the reticle R (FIG. 4A) to g-EGA. According to g-EGA in this embodiment, after measuring the coordinate positions of m-pieces of sample shots, the transform matrices (parameters a–f) are determined per virtual shot in which the latent images are to be formed. The array coordinate values thereof are thus calculated. Further, the system controller 65 brings the wafer stage WS into the stepping action in accordance with the array coordinate values of the plurality of virtual shots. Formed are the latent images of the two reticle marks $RM_{x1}$, $RM_{y1}$ per virtual shot.

Thereafter, the system controller 65 measures the positions of all the latent image marks formed on the wafer W by using the two LSA systems. As in absolutely the same way with the first embodiment, e-EGA is conducted by employing the positions of the latent image marks per virtual shot. The transform matrices AT, Ot are thereby calculated. According to t-EGA in this embodiment, one set of transform matrices AT, Ot are calculated definitely the same with the first embodiment, i.e., through the calculations by the conventional EGA. Next, the EGA calculation unit 62 determines the transform matrices A, O per shot area on the wafer W. This determination involves the use of the coordinate positions of all t:he sample shots that are measured by g-EGA and the transform matrix Ot calculated by t-EGA, i.e., the offset errors (Otx, Oty). Their array coordinate values (Fx, Fy) are thereby calculated. That is, in accordance with this embodiment, the transform matrices are determined per shot area by employing the coordinate positions of the sample shots, to which the weight is given. Thereafter, it follows that the array coordinate values are calculated based on the thus determined transform matrices and the offset errors (Otx, Oty). As a result, when stepping the wafer stage WS according to the calculated result given by the EGA calculation unit 62. Hereat, the projection images of the reticle pattern is superposed exactly on the shot area, and the exposure is thus performed.

As discussed above, in this embodiment, even when the adopting the P-EGA system in the main exposure, the system offset can be calculated by applying the EGA system. The high-speed and high-accuracy overlay exposure can be conducted. By the way, this embodiment has dealt with only the measurement and correction of the system offset. However, the residual rotational error of the reticle R and even the projection magnification of the projection optical system can be measured definitely the same with the second embodiment by using the reticle R shown in, e.g., FIG. 14A. The correction may be made by the same method as the above-mentioned. Further, the array coordinate values of the shot areas are calculated after t-EGA in this embodiment. The array coordinate values of all the shot areas are, however, calculated together with the plurality of virtual shots by g-EGA. In the case of positioning the wafer stage WS according to these array coordinate values immediately after an end of t-EGA, the wafer stage may be positioned with a shift corresponding to the offset error calculated by t-EGA. Further, the weight is given to the alignment data in accordance with the distances between the shot area and each of the plurality of sample shots in the P-EGA system. However, the weight may be imparted to the alignment data in accordance with a distance between, e.g., the i-th shot area and the wafer center and distances between each of the plurality of sample shots and the wafer center. At this time, the maximum weight is the one given to such a sample shot that a difference between the above-mentioned two distances is zeroed or minimized.

By the way, the two wafer marks are provided per shot area in the embodiments discussed above. Three or more wafer marks may be, however, provided. For instance, four wafer marks may be disposed at the four corners of the shot area. At this time, even in the reticle R, four reticle marks are formed at the four corners of the pattern area. The g-EGA is conducted with the aid of the four wafer marks by the same actions as those in the embodiment discussed above. Herein, when determining the coordinate positions thereof per sample shot by g-EGA, the coordinate positions are determined by use of the respective positions (a mean value) of the wafer marks formed at the four corners of each shot. Subsequently, the latent images of the four reticle marks are formed for each of the plurality of virtual shots on the basis of the result given by g-EGA. Thereafter, the coordinate positions thereof are determined per virtual shot by employing the respective positions of the four latent images formed at the four corners (e.g., by taking an average) in t-EGA. Further, as similar to the embodiments described above, the system offset is determined based on the respective results by g- and t-EGAs. As discussed above, the coordinate positions of virtual shots and the sample shots are determined by employing the marks formed at the four corners. It is thus possible to remarkably reduce the in-shot maximum positional deviation quantity derived from the imaging characteristics (distortion, etc.) of the projection optical system and the expansion/contraction of the wafer (scaling). The calculating accuracy of the system offset, i.e., the alignment accuracy can be further improved. Besides, it is desirable that the shot rotational error and magnification (including a distortion quantity) be obtained from the four mark positions by g- and t-EGAs, respectively. With this processing, it is possible to correct the rotational error (chip rotation) per shot area and the magnification error, the imaging characteristics (projection magnification, distortion, etc.) of the projection optical system and even a manufacturing error of the reticle R. Note that the four wafer marks and reticle marks may not be formed at the four corners. The positional deviation is, however, maximized at the four corners on the outermost periphery. For this reason, it is advantageous in terms of the accuracy to measure the various errors that the marks are formed, as a matter of fact, at the four corners. Further, five or more wafer marks and reticle marks may be provided per shot, whereby the measuring accuracy or the like can be more improved. Besides, preferably the marks shown in FIG. 14B are used as the wafer and reticle marks.

Note that the residual rotational error of the reticle R and the projection magnification of the projection optical system 13 can be measured in addition to the system offset by using the reticle R illustrated in FIG. 14A in each of the embodiment discussed above. At this time, even the distortion of the projection optical system 13 can be measured by increasing the number of the latent image marks formed in one virtual shot, viz., the number of the reticle marks. These imaging characteristics are also correctable by the imaging characteristic correction unit 19. Further, the imaging characteristic correction unit 19 drives at least one of a plurality of lens elements constituting the projection optical system 13. Excepting this, however, as disclosed in, e.g., U.S. Pat. No. 4,871,237, there may be adopted a system for sealing an air space sandwiched in between two lens elements and controlling a pressure of this sealed air space. Moreover, the projection magnification is finely adjusted by this pressure control system, and the distortion may be finely adjusted by driving the lens element or the reticle.

Further, the present invention, is applied to the projection exposure apparatus of the step-and-repeat system in each of the embodiments discussed above. The present invention is, however, applicable to exposure apparatuses of a variety of systems, including, e.g., a projection exposure apparatus of a step-and-scan system. Especially in the projection exposure apparatus of the step-and-scan system, the reticle and the wafer are relatively moved, thus effecting the exposure. It is not therefore realistic to execute the die-by-die alignment by using, e.g., the TTR system alignment sensor. The present invention is highly effective. Note that a start-of-exposure position is determined based on the array coordinates (Fx, Fy) determined by the foregoing formula (11) and a size, etc. of the pattern area of the reticle or the shot area on the wafer.

It is apparent that, in this invention, a wide range of different working modes can be formed based on the invention without deviating from the spirit and scope of the invention. This invention is not restricted by its specific working modes except being limited by the appended claims.

Figure 18A:
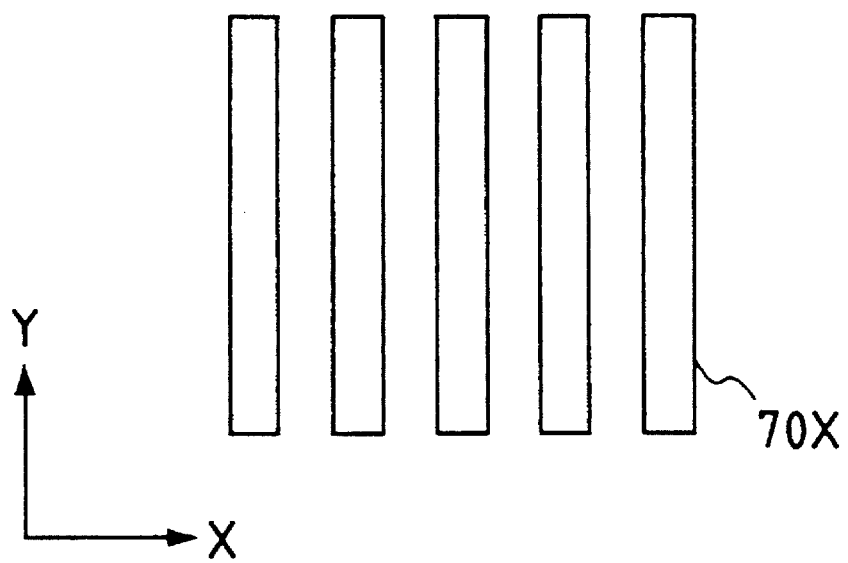
FIGS. 18A and 18B show the specific construction of a reticle mark used in a fourth embodiment.
Figure 18B:
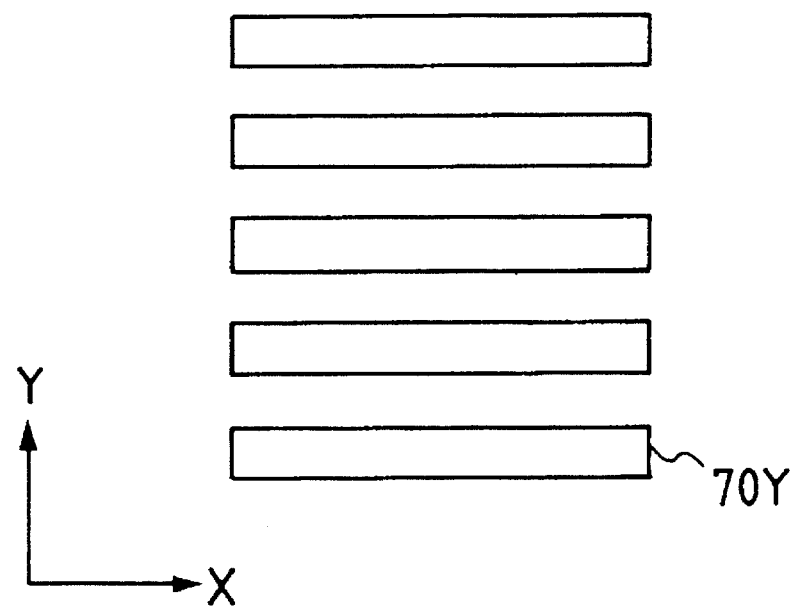

A fourth embodiment of the present invention will now be described. In this embodiment, description will be made of the alignment (focusing) of the best imaging plane of the projection optical system 13 and the surface of the wafer W in the projection exposure apparatus shown in FIGS. 1–3. In the present embodiment, it is to be understood that prior to superposing and exposing the image of the pattern of the reticle R onto each shot area on the wafer W by adopting the EGA system, the latent image of the reticle mark is formed on the wafer W of FIG. 7 and by the use of the LIA system, the latent image is detected to thereby determine the best focus position of the projection optical system 13. Also, on the reticle R of FIG. 4A, the diffraction grating mark 70X of FIG. 18A is formed as reticle marks $RMx_1$ and $RMx_2$, and the diffraction grating mark 70Y of FIG. 18B is formed as reticle marks $RMy_1$ and $RMy_2$. The diffraction grating mark 70X comprises fine light-intercepting straight marks extending in Y-direction and arranged in X-direction, and the diffraction grating mark 70Y is one obtained by rotating the diffraction grating mark 70X by 90°.

Now, the exposure sequence of the present embodiment will be described with reference to FIG. 19. It is to be understood here that the loading of the reticle R, fine alignment and base line measurement described in the first embodiment have already been terminated.

Figure 19:
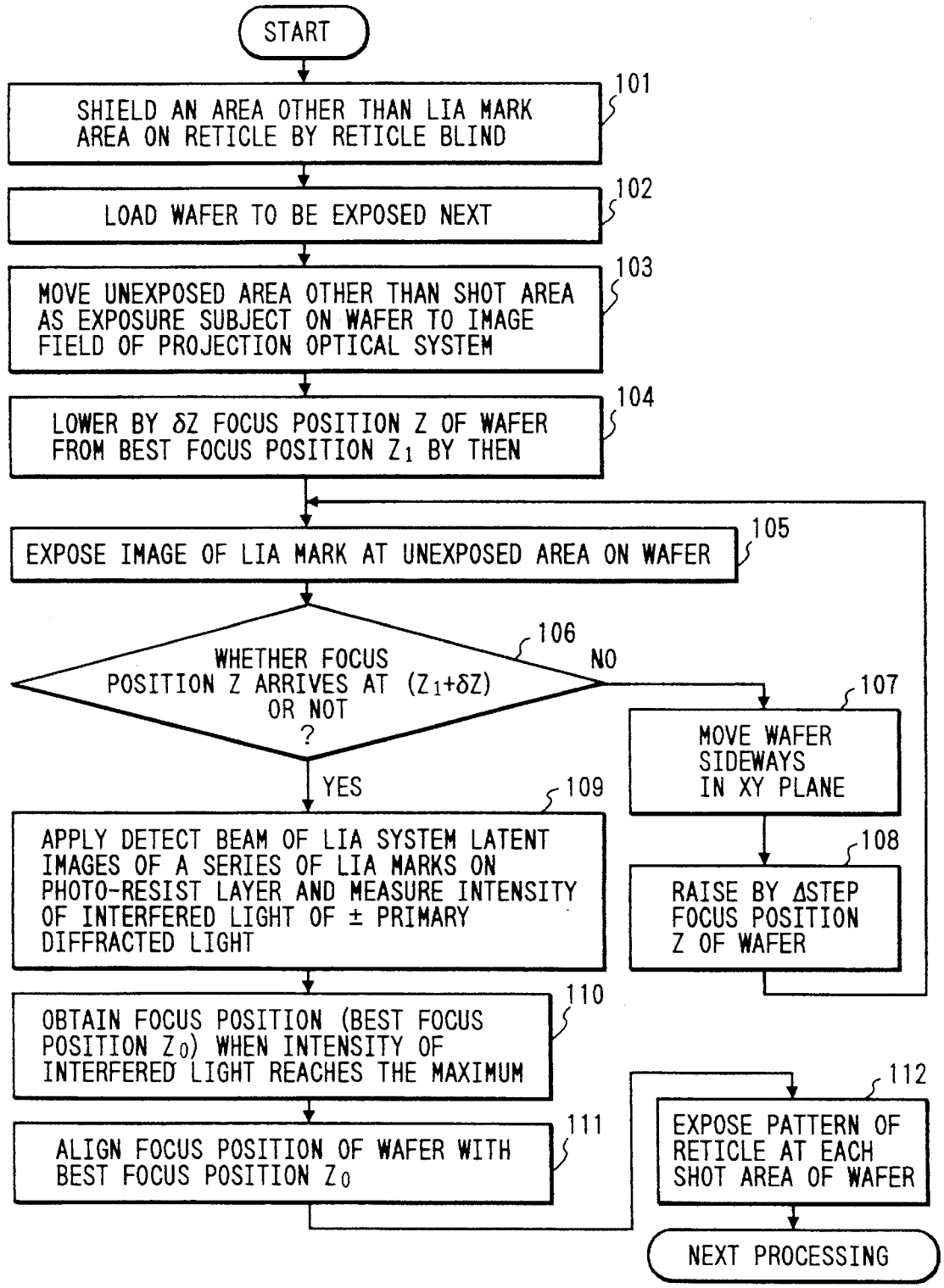
FIG. 19 is a flow chart showing an example of the exposure sequence in the fourth embodiment.

At the step 101 of FIG. 19, the main control system 18 drives the reticle blind 6 and regulates the illumination field so that the exposure light IL may be applied to only the diffraction grating mark (LIA mark) 70Y on the reticle R disposed on the object plane side of the projection optical system 13. Thereby, the other area than the LIA mark 70Y is shielded. Thereafter, the wafer W (FIG. 7) is loaded onto the wafer stage WS (step 102).

Subsequently, at a step 103, of the unexposed areas $ND_1$–$ND_5$ on the wafer W, the unexposed area $ND_5$ is moved into the projection field (image field) of the projection optical system 13. The position (focus position) of the wafer W in Z-direction parallel to the optical axis AX of the projection optical system 13 is then lowered by a predetermined amount $\delta Z$, for example, from the best focus position $Z_1$ in design or during the last measurement (step 104). This predetermined amount $\delta Z$ is determined such that the accurate best focus position reliably falls within the range of $(Z_1 \pm \delta Z)$. The projected image of the LIA mark 70Y of the reticle R is then exposed onto the unexposed area $ND_5$ on the wafer W (step 105). It is desirable that the exposure amount when the LIA mark 70Y is transferred onto the wafer W be set to an amount equal to or greater than the proper exposure amount when the reticle pattern is transferred onto the wafer W, e.g. about three or four times as great as said proper exposure amount.

Thereafter, at a step 106, whether the focus position Z has arrived at $(Z_1 + \delta Z)$ is examined, but it has not arrived at $(Z_1 + \delta Z)$ this time and therefore, the operation shifts to a step 107. At the step 107, the wafer stage WS is driven to move the wafer W sideways in XY plane, and at the next step 108, the focus position Z of the wafer W is raised by a width $\Delta$step. The width $\Delta$step is selected to the order of the resolving power when the best focus position is determined (the order of the detection resolving power of the AF sensor 81). When the wafer W is thus raised by the width $\Delta$step, the system controller 65 effects the positioning of the wafer stage WS in Z-direction in conformity with the focus signal from the AF sensor 81 (or the measurement value of the linear encoder for Z-direction in the wafer stage WS). Thereafter, return is made to the step 105, where the image of the LIA mark 70Y on the reticle R is exposed at another position in the unexposed area $ND_5$ on the wafer W. By the steps 106, 107, 108 and 105 being repeated, the image of the LIA mark 70Y is exposed at a plurality of measurement shot areas in the unexposed area $ND_5$ on the wafer W. When at the step 106, the focus position Z has arrived at $(Z_1 + \delta Z)$, the operation shifts to a step 109.

Figure 20A:
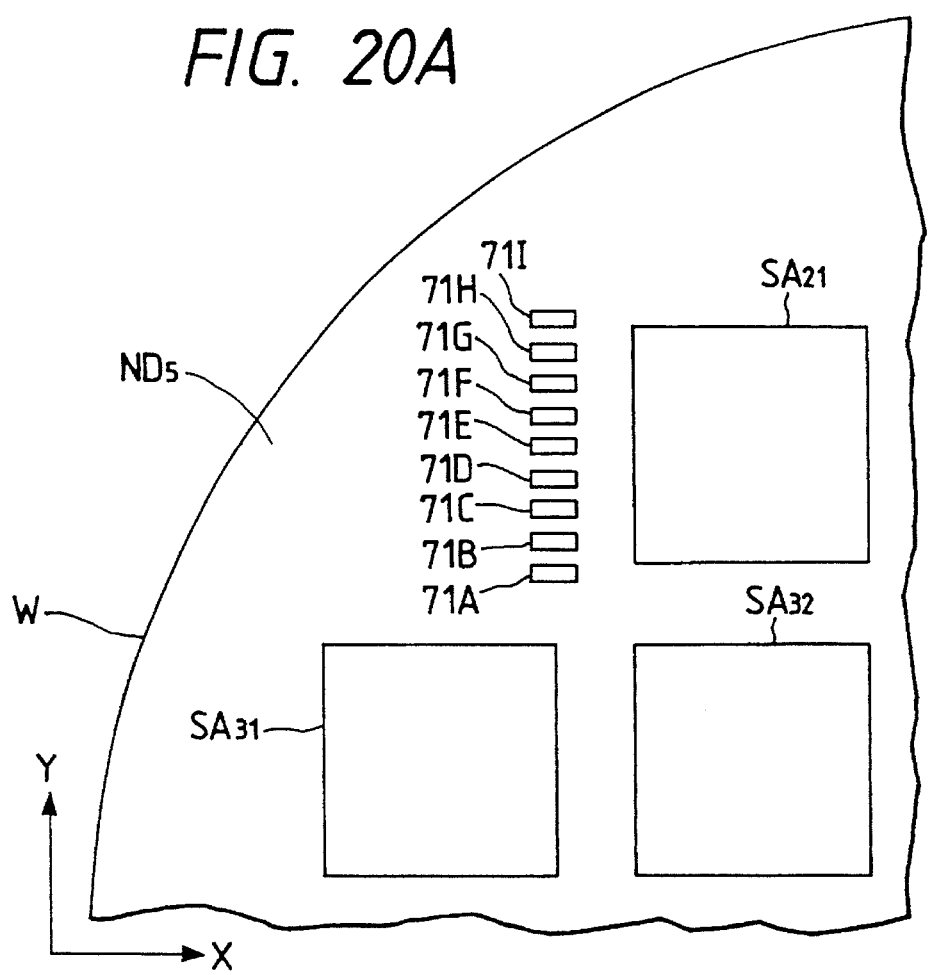
FIGS. 20A, 20B and 20C are views for illustrating the exposing operation of the fourth embodiment.
Figure 20B:
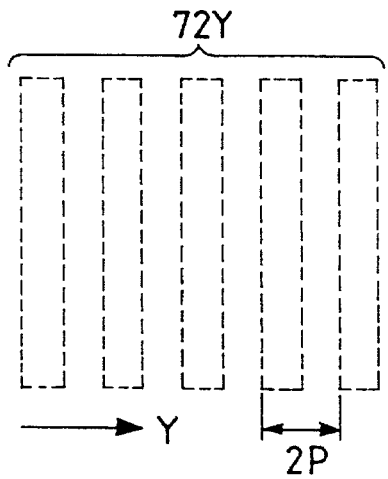

Thereby, as shown in FIG. 20A, the latent image pattern of the LIA mark 70Y is formed in each of the plurality of measurement shot areas 71A–71I in the unexposed area $ND_5$ on the wafer W. The latent image pattern of the LIA mark 70Y, as shown in FIG. 20B, is diffraction grating-like latent image pattern 72Y formed at a pitch 2P in Y-direction. Thereafter, at the step 109, two beams emitted from the LIA optical system 45 of FIG. 2 are applied onto each latent image pattern of the LIA mark to thereby detect the intensity of the interference light of +1st-order diffracted light and −1st-order diffracted light.

Figure 20C:
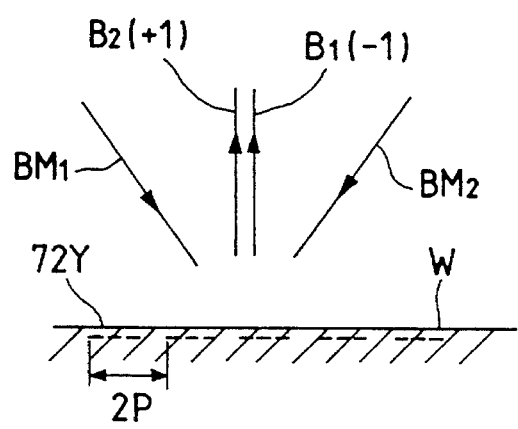

That is, as shown in FIG. 20C, two detection lights $BM_1$ and $BM_2$ are symmetrically applied onto each latent image pattern 72Y at an equal angle of incidence, and the −1st-order diffracted light $B_1(-1)$ of the detection light $BM_1$ and the +1st-order diffracted light $B_2(+1)$ of the detection light $BM_2$ emerge substantially perpendicularly from the wafer W in parallelism to each other. The intensity of the interference light of the −1st-order diffracted light $B_1(-1)$ and the +1st-order diffracted light $B_2(+1)$ is detected as the photoelectric signal SDW of the photoelectric detector 52 of FIG. 2. In other words, the pitch 2P of the latent image pattern 72Y is set to such a value that the −1st-order diffracted light $B_1(-1)$ and the +1st-order diffracted light $B_2(+1)$ become parallel to each other. In this case, a photoelectric signal SR for reference obtained by photoelectrically converting the interference light of the diffracted lights of the detection lights $BM_1$ and $BM_2$ by the diffraction grating 55 for reference is outputted from the photoelectric detector 56.

Figure 21:
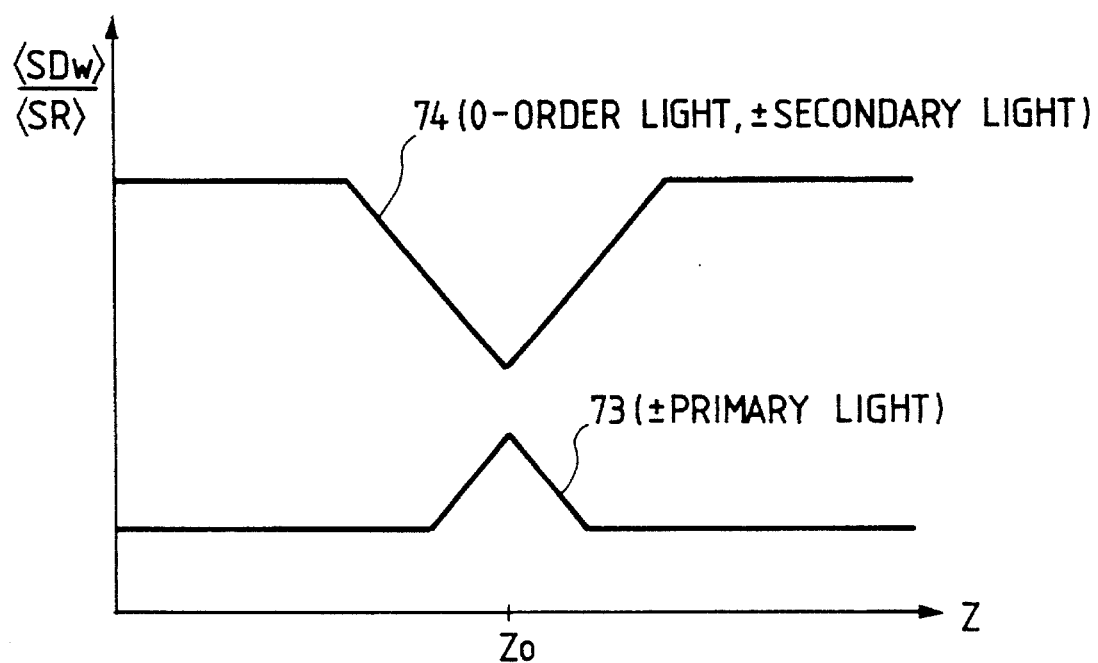
FIG. 21 is a graph representing the relation between a photoelectric signal obtained from the latent image of LIA mark and the focus position.

So, the LIA calculation unit 58 of FIG. 3 calculates the value $<SD_w>/<SR>$ of the ratio of the peak value $<SD_w>$ of the amplitude of the photoelectric signal $SD_w$ to the amplitude $<SR>$ of the photoelectric signal SR for reference, for each latent image pattern 72Y, and supplies the value of this ratio to the EGA calculation unit 62 through the alignment data storing unit 61. The value of the ratio, when plotted relative to the focus position Z corresponding to the plurality of measurement shot areas 71A–71I of FIG. 20A, becomes like the curve 73 of FIG. 21. That is, when ±1st-order diffracted lights are used, the value $<SD_w>/<SR>$ of the ratio becomes maximum when the focus position Z is the true best focus position $Z_0$. By the utilization of this, at a step 110, the EGA calculation unit 62 determines the focus position $Z_0$ when the value $<SD_w>/<SR>$ of the ratio becomes maximum, that is, when the intensity of the interference light of ±1st-order diffracted lights becomes maximum, as the best focus position for the projection optical system 13. The curve 73 of FIG. 21 is actually one obtained by data discrete with respect to the focus position Z being approximated by a curve. When the best focus position is to be determined from the discrete data, the value $<SD_w>/<SR>$ of a series of ratios for each focus position Z is approximated by a curve of a predetermined order number (an approximate curve) by the use, for example, of the minimum squaring method, and the focus position corresponding to the maximum value of this approximate curve is determined as the best focus position. The information of this best focus position $Z_o$ is supplied to the system controller 65.

Subsequently, at a step 111, the system controller 65 drives the wafer stage WS in Z-direction and sets the surface of the fiducial member 14 at the best focus position $Z_0$. A beam of imaging light is applied from the light transmitting system 81a of the AF sensor 81 to the reflecting surface of the fiducial member 14 and the plane parallel glass 82e is inclined through a driving system 83 shown in FIG. 23 to thereby effect the calibration of the AF sensor 81. Thereby, the surface of the wafer W can be set at the true best focus position $Z_0$ of the projection optical system 13 very quickly and accurately by the use of the AF sensor 81 without the development of the wafer W being effected and with the influence of the ground of the wafer W being taken into account.

Thereafter, at a step 112, alignment of the EGA type is effected, whereby the image of the pattern of the reticle R is exposed at each shot area of the wafer W. In the present embodiment, only g-EGA (expression (1)) using the FIA system described in the first embodiment is executed to thereby calculate the arrangement coordinates value of each shot area on the wafer, and the base line amount is added to this arrangement coordinates value, whereafter the positioning of the wafer is effected.

Here, description will be made of a modification of the method of determining the best focus position of the projection optical system 13. First, in the above-described embodiment, the latent images of the LIA marks have been formed on the circumferential unexposed areas (such as $ND_5$) of the wafer W, but the latent images of those LIA marks may be formed, for example, on a street line area which partitions the shot areas $SA_{ij}$.

Also, as described above, when the detection of the latent image pattern 72Y is to be effected by the use of the LIA system, use has been made of ±1st-order diffracted lights from the latent image pattern 72Y. Besides, use can also be made of the interference light of 0-order diffracted light and +2nd-order diffracted light from the latent image pattern 72Y, the interference light of 0-order diffracted-light and −2nd-order diffracted light, or the interference light of a combination of other diffracted lights. This will now be described in detail with reference to FIGS. 9A and 9B. Here, description will be made with wafer marks GA and GB in FIGS. 9A and 9B as a latent image pattern 72. In FIG. 9A, when two coherent detection beams $BM_1$ and $BM_2$ having a frequency difference $\Delta f$ therebetween are incident on the diffraction grating-like latent image pattern 72Y of pitch 2P at an angle of intersection $2\cdot\phi_0$, one dimensional interference fringes IF of pitch P are produced on the latent image pattern 72Y. As a result, diffracted lights $B_1(-1)$, $B_2(+1)$, ... are generated from the latent image pattern 72Y.

In this case, the 0-order diffracted light $B_2(0)$ of the detection beam $BM_2$ and the −2nd-order diffracted light $B_1(-2)$ of the detection beam $BM_1$ emerge in parallelism to each other and therefore, even if the interference light of those 0-order diffracted light $B_2(0)$ and −2nd-order diffracted light $B_1(-2)$ are used, the best focus position of the projection optical system 13 can be determined. Likewise, even if the interference light of 0-order diffracted light $B_1(0)$ and −2nd-order diffracted light $B_2(+2)$ is used, the best focus position of the projection optical system can be determined. Also, since ±2nd-order diffracted lights are not ouputted for the latent image pattern 72Y having an ideal light-and-shade distribution, ±2nd-order diffracted lights are not generated at the true best focus position $Z_0$. Therefore, the value $<SD_w>/<SR>$ of the ratio of the amplitude $<SD_w>$ of the photoelectric signal $SD_w$ of the interference light of 0-order diffracted light and −2nd-order diffracted light (or +2nd-order diffracted light) to the amplitude $<SR>$ of the photoelectric signal SR for reference beams minimum when as shown in FIG. 21, the focus position Z coincides with the true best focus position $Z_0$. Accordingly, when the interference light of 0-order diffracted light and 2nd-order diffracted light is used, the best focus position $Z_0$ can be determined from the focus position when the value of the ratio becomes minimum.

That is, methods of detecting the latent image pattern of pitch 2P by the LIA system and determining the best focus position include various methods such as a first mode using ±1st-order diffracted lights $B_1(-1)$ and $B_2(+1)$, a second mode using 0-order diffracted light $B_2(0)$ and −2nd-order diffracted light $B_1(-2)$, and 0-order diffracted light $B_1(0)$ and −2nd-order diffracted light $B_2(+2)$, and a third mode for averaging the best focus positions determined in the first mode and the second mode.

Figure 9B:
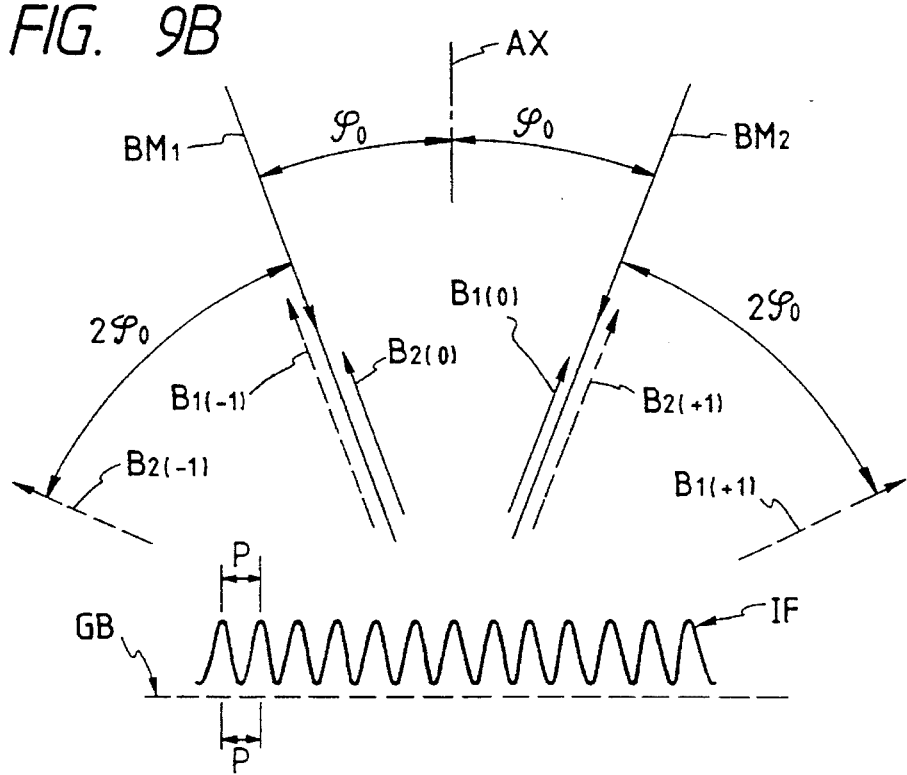

Further, as shown in FIG. 9B, the pitch of the latent image pattern 72Y in Y-direction may be P. In such case, when two coherent detection beams $BM_1$ and $BM_2$ having a frequency difference $\Delta f$ therebetween are incident on the latent image pattern 72Y at an angle of intersection $2\cdot\phi_0$, one-dimenional interference fringes IF of pitch P are produced on the latent image pattern 72Y. From the latent image pattern 72Y, 1st-order diffracted lights $B_2(+1)$ and $B_1(-1)$ are generated at angles of diffraction $\phi_0$ and $-\phi_0$, respectively. Also, 0-order diffracted light $B_1(0)$ emerges in parallelism to 1st-order diffracted light $B_2(+1)$, and 0-order diffracted light $B_2(0)$ emerges in parallelism to −1st-order diffracted light $B_1(-1)$. Accordingly, the best focus position of the projection optical system 13 can also be determined by detecting the intensity of the interference light of 1st-order diffracted light $B_2(+1)$ and 0-order diffracted light $B_1(0)$ or the interference light of −1st-order diffracted light $B_1(-1)$ and 0-order diffracted light $B_2(0)$.

In the LIA system of the above-described embodiment, use is made of a heterodyne system in which the frequencies of two detection beams differ from each other, but use may also be made of a homodyne system in which the frequencies of two detection beams are the same. In the heterodyne system, interference fringes by the two beams of light flow on the mark and a sine wave-like photoelectric signal is obtained and therefore, the value of ratio (such as $SD_f/SR$) is used, while in the homodyne system, stationary interference fringes are formed on the mark. That is, in the homodyne system, the photoelectric signal does not vary in its intensity unless the mark and the interference fringes are scanned relative to each other and therefore, the wafer stage WS is moved by $\Delta STEP$ in Z-direction and the signal level for each focus position is plotted on the graph, and the position at which the signal level becomes maximum (or minimum) can be determined as the best focus position.

Figure 22A:
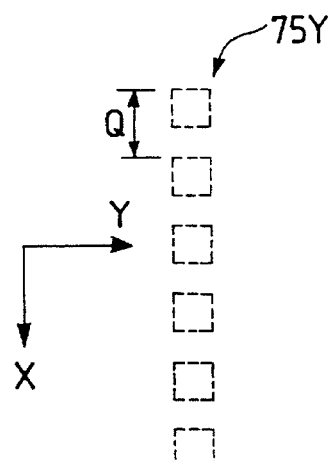
FIGS. 22A, 22B, 22C and 22D are for illustrating the measuring operation for the best focus position using LSA mark.
Figure 22B:
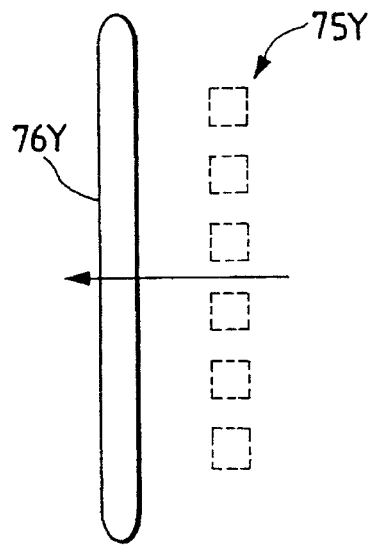

Also, in lieu of the LIA mark, a diffraction grating mark suitable for the LSA system (LSA mark) may be used and the LSA system may be used for the detection of the latent image. In such case, the latent image pattern 75Y of LSA marks as shown in FIG. 22A wherein six dot marks are arranged at a predetermined pitch in X-directin is formed in each of the plurality of measurement shot areas 71A–72I of FIG. 20A. Thus, the exposure amount when the LSA marks are transferred onto the wafer W may preferably be about three times as great as the proper exposure amount when the reticle pattern is trnasferred onto the wafer. To effect the detection of the latent image pattern 75Y, a laser beam emitted from the LSA optical system 46 (see FIG. 3) in the alignment sensor 17 of FIG. 1 is applied as a slit-like spotlight 76Y which is long in X-direction as shown in FIG. 22B. When the wafer stage WS is then driven in Y-direction to thereby scan the latent image pattern 75Y relative to the spotlight 76Y, diffracted light is generated from the latent image pattern 75Y in a predetermined direction. A photoelectric signal $SD_i$ obtained by this diffracted light being photoelectrically converted by the photoelectric detector 52 of FIG. 2 is supplied to the LSA calculation unit 57.

Figure 22C:
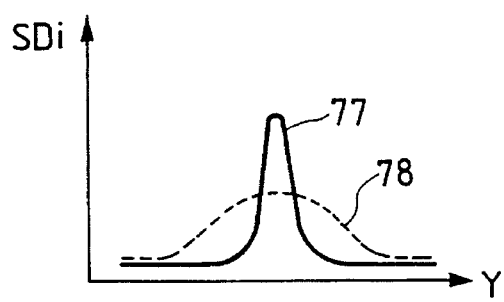
Figure 22D:
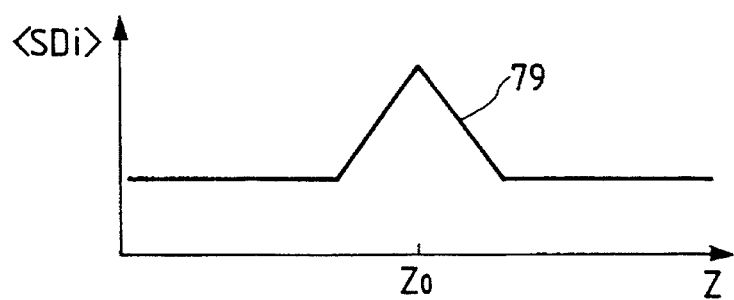

FIG. 22C shows the waveform of the photoelectric signal $SD_i$. In FIG. 22C, a curve 77 indicates the photoelectric signal $SD_i$ when the focus position Z of the latent image pattern 75Y is at the best focus position. Also, when the focus position Z deviates from the best focus position, the peak value of the photoelectric signal $SD_i$ becomes small as indicated by a curve 78. Accordingly, when the peak value $<SD_i>$ of the photoelectric signal $SD_i$ at each focus position is plotted relative to the focus position Z, there is obtained a curve 79 as shown in FIG. 22D which assumes a peak at the best focus position $Z_0$. So, the focus position at which the peak value $<SD_i>$ of the photoelectric signal $SD_i$ becomes maximum can be determined as the best focus position $Z_0$ of the projection optical system 13.

When the LSA system is used for the detection of the latent image, the LSA mark formed on the reticle R may be formed in a light intercepting portion by a light transmitting portion, that is, the dot marks may be the light transmitting portion. Accordingly, it is desirable that the interior of the dots 2–7 of the latent image pattern 75Y of the LSA mark shown in FIG. 12A be the area to which light is applied. Also, the LSA mark corresponding to the latent image pattern 75Y shown in FIG. 22A may be provided in a plurality of rows in the measurement direction (Y-direction) to provide a multimark. It has been confirmed by an experiment that the image of such a multimark is formed as a latent image pattern on the resist of the wafer W, whereby detection accuracy is improved.

In the above-described fourth embodiment, the best focus position of the projection optical system 13 has been determined, whereafter the surface of the wafer W has been set at this best focus position and the pattern image of the reticle R has been exposed. In the present embodiment, however, there is obtained the effect that simply by measuring the best focus position of the projection optical system 13, the measurement can be effected quickly and highly accurately. Also, at the step 112 of FIG. 19, only g-EGA (expression (1)) has been executed, but as in the first embodiment, both of g-EGA and t-EGA (expression (5)) may be executed so that the arrangement coordinates values of all shot areas on the wafer W may be calculated from expression (11). Further, the reticle mark for focus measurement to be formed as a latent image on the wafer (in the present embodiment, the diffraction grating mark 70Y of FIG. 18B) may be formed on any of a device reticle having a circuit pattern to be transferred to the wafer and a test reticle exclusively for use for measurement. Also, the location of the reticle mark on the reticle may be arbitrary. For example, where the reticle is a multidie reticle having a plurality of circuit patterns, the reticle mark may be formed on the boundary portion between adjacent circuit patterns (an area corresponding to the street line). Further, the reticle mark for focus measurement may be a mark exclusively for use for measurement or a mark serving also as an alignment mark.

Also, a plurality of marks for focus measurement are formed on the reticle R and as in the fourth embodiment, for each of the marks, the latent image thereof is formed on the wafer and the best focus position is measured. The plurality of best focus positions thus measured may be subjected to an averaging process (such as simple averaging or weighted mean) and the average value may be determined as the best focus position. Also, a plurality of best focus positions may be satistically calculated (as by the least square method) to thereby detect the best imaging plane (approximate plane) of the projection optical system 13, and the best focus position may be determined from this approximate plane. At this time, even the curvature of image field and inclination of image field of the projection optical system 13 can also be determined.

Further, LIA marks 70X and 70Y (FIGS. 18A and 18B) are formed on the reticle R in proximity to each other. At this time, the arrangement directions (pitch directions) of the LIA marks 70X and 70Y are made coincident with the sagittal direction (S-direction) and meridional direction (M-direction) respectively, of the projection optical system 13. Just as in the fourth embodiment, a wafer W is disposed at each of a plurality of focus positions and the images of the LIA marks 70X and 70Y are exposed, and the latent images of the two marks are independently detected by the use of the LIA system. Thereby, the best focus positions in S-direction and M-direction are determined, that is, astigmatism is found. In this case, the two best focus positions are averaged and the average value is determined as the best focus position.

What is claimed is:

1. An apparatus for exposing patterns formed on a mask on each of a plurality of exposure areas of a photosensitive substrate, said apparatus comprising:

a stage for two-dimensionally moving said photosensitive substrate while holding said substrate;

a first measuring means for measuring respective positions when aligning some of said plurality of exposure areas with a predetermined fiducial position within a static coordinate system for defining moving positions of said stage, said first measuring means including a mark detection system for detecting alignment marks of said exposure areas;

a calculating means for determining parameters in a predetermined calculation formula used for calculating respective array coordinate values of said plurality of exposure areas by statistically calculating said plurality of positions measured by said first measuring means, said calculating means calculating array coordinate values of at least one predetermined specific area on said photosensitive substrate on the basis of said calculation formula including said determined parameters;

a means for exposing specific marks formed on said mask on said specific area by moving said stage in accordance with said calculated array coordinate values;

a second measuring means for measuring positions when aligning at least said one specific area with a predetermined fiducial position within said static coordinate system, said second measuring means including a latent image detection system for detecting latent images of said specific marks exposed; and a means for correcting a positional relationship of said mask pattern versus each of the plurality of exposure areas on said photosensitive substrate on the basis of at least one of deviations between said positioned measured by said second measuring means and said positions calculated by said calculation means.

2. A method of transferring the pattern of a mask to a plurality of areas on a substrate, comprising:

the first step of measuring the coordinates positions of some of said plurality of areas on a stationary coordinates system prescribing the moved position of said substrate, and statistically calculating said plurality of coordinates positions to thereby calculate the parameter of a first function corresponding to the arrangement of said plurality of areas;

the second step of calculating the coordinates position of each of a plurality of particular areas on said substrate on said stationary coordinates system by the use of the first function including said calculated parameter, and moving said substrate on the basis of said calculated coordinates position to thereby form the latent image of a particular mark of said mask on each of said plurality of particular areas; and the third step of measuring the coordinates position of each of said plurality of latent images on said stationary coordinates system, and transferring the pattern of said mask to each of said plurality of areas by the utilization of said plurality of coordinates positions.

3. A method according to claim 2, wherein said third step includes the step of statistically calculating said plurality of coordinates positions to thereby calculate the parameter of a second function corresponding to the arrangement of said plurality of particular areas, and wherein the parameter of said second function is utilized for the transfer of the pattern of said mask to each of said plurality of areas.

4. A method according to claim 3, further comprising:

the step of correcting the parameter of said first function on the basis of the parameter of said second function, and calculating the coordinates position of each of said plurality of areas on said stationary coordinates system by the use of the first function including said corrected parameter; and the step of moving said substrate on the basis of said calculated coordinates positions.

5. A method of exposing the image of the pattern of a mask onto a substrate by the use of a projection optical system, comprising:

the first step of disposing a mask having a particular mark on the object plane side of said projection optical system;

the second step of positioning said substrate at each of a plurality of positions in the direction of the optical axis of said projection optical system, and forming the latent image of said particular mark on said substrate;

the third step of applying illumination light to each of the plurality of latent images formed on said substrate, detecting the intensity of light generated from said latent images, and determining the best focus position of said projection optical system on the basis of said detected intensity of light; and the fourth step of positioning said substrate at said best focus position and exposing the image of the pattern of said mask onto said substrate.

6. A method according to claim 5, wherein said second step includes the sub-step of moving said substrate in a direction perpendicular to the optical axis of said projection optical system each time the latent image of said particular mark is formed on said substrate.

7. A method according to claim 5, wherein at said second step, the latent image of said particular mark is formed in other area on said substrate than the area on which the image of the pattern of said mask is exposed.

8. A method according to claim 5, wherein said particular mark is a diffraction grating mark and at said second step, a position in the direction of said optical axis at which the intensity of diffracted light generated from said diffraction grating mark becomes maximum or minimum is determined as the best focus position.

9. A method of measuring the focus position of a projection optical system, comprising:

the step of disposing a first substrate having a particular mark on the object plane side of said projection optical system;

the step of positioning a photosensitive second substrate at each of a plurality of positions in the direction of the optical axis of said projection optical system, and forming the latent image of said particular mark on said second substrate; and the step of applying illumination light to each of the plurality of latent images formed on said second substrate, and determining the focus position of said projection optical system on the basis of the intensity of light generated from said latent images.

10. A method for performing an alignment of an image of a pattern on a mask with each of a plurality of areas, on a photosensitive substrate, which is exposed by the pattern image, the method comprising:

measuring at least three positions within said plurality of areas and performing a statistic treatment of those measured positions, so that parameters in a first model formula corresponding to an arrangement of said plurality of areas are obtained;

calculating, based on the first model formula, a position of each of a plurality of special areas on said photosensitive substrate and relatively moving the mask and the photosensitive substrate in response to the calculated positions to expose each of said plurality of special areas by an image of a mark on the mask, so that a latent image of the mark is formed at each of the plurality of special areas;

measuring a position of each of the plurality of latent images and performing a statistic treatment of the measured positions, so that parameters in a second model formula corresponding to an arrangement of the plurality of latent images are obtained, the parameters corresponding to deviations between the calculated positions and the measured positions in the special areas; and performing an alignment of the pattern image with each of the plurality of areas based on the parameters in the second model formula.

11. A method according to claim 10, further comprising:

calculating a position of each of said plurality of areas based on parameters in said first and second model formulas and relatively moving said mask and said photosensitive substrate according to the calculated positions, so that an alignment of a pattern image of said mask with each of the plurality of areas is performed.

12. A method according to claim 10, further comprising:
setting the plurality of special areas at a peripheral area other than said plurality of areas on said photosensitive substrate.

13. A method for performing an alignment of an image of a pattern on a mask with each of a plurality of areas, on a photosensitive substrate, which is exposed by the pattern image, the method comprising:

measuring at least three positions within said plurality of areas and performing a statistic treatment of the measured positions, so that parameters in a first model formula corresponding to an arrangement of said plurality of areas are obtained;

calculating, based on the first model formula, a position of each of a plurality of special areas on said photosensitive substrate and relatively moving the mask and the photosensitive substrate in response to the calculated positions, so that a latent image of the mark on the mask is formed at each of said plurality of special areas;

measuring a position of each of the plurality of latent images and performing a statistic treatment of the measured positions, so that parameters in a second model formula corresponding to an arrangement of the plurality of latent images are obtained; and correcting parameters in said first model formula according to parameters in said second model formula and performing an alignment of said pattern image with each of the plurality of areas based on the corrected parameters.

14. A method according to claim 13, further comprising:
calculating a position of each of said plurality of areas based on said corrected parameters, and relatively moving said mask and said photosensitive substrate according to the calculated positions, so that an alignment of the pattern image of the mask with each of said plurality of areas is performed.

15. A method for performing an alignment of an image of a pattern on a mask with each of a plurality of areas, on a photosensitive substrate, which is exposed by the pattern image, the method comprising:

measuring at least three positions within the plurality of areas and performing a statistic treatment of the measured positions, so that parameters in a model formula corresponding to an arrangement of the plurality of areas are obtained;

calculating a position of at least one special area on the photosensitive substrate based on the model formula and relatively moving the mask and the photosensitive substrate in response to the calculated position, so that a latent image of a mark on the mask is formed at least at one special area;

measuring a position of the latent image formed at least at said one special area to correct the parameters based on the measured position; and performing an alignment of the pattern image with each of the plurality of areas based on the corrected parameters.

16. A method according to claim 15, further comprising:
calculating a position of each of the plurality of areas based on the corrected parameters and relatively moving said mask and said photosensitive substrate according to the calculated positions, so that an alignment of said pattern image of the mask with each of the plurality of areas is carried out.

17. A method for performing an alignment of an image of a pattern on a mask with each of a plurality of areas, on a photosensitive substrate, which is exposed by the pattern image, the method comprising:

measuring at least three positions within the plurality of areas and performing a statistic treatment of the measured positions, so that a position of at least one special area which is different from the plurality of areas is calculated;

relatively moving the mask and the photosensitive substrate according to the calculated position of said at least one special area, so that a latent image of a mark on the mask is formed at said at least one special area; and measuring a position of the latent image formed at said at least one special area and performing an alignment of the pattern image with each of the plurality of areas based on a deviation between the measured position and the calculated position.

* * * * *